US012666604B2

(12) United States Patent
Kim et al.

(10) Patent No.: US 12,666,604 B2
(45) Date of Patent: Jun. 23, 2026

(54) SEMICONDUCTOR DEVICE AND MANUFACTURING METHOD THEREOF

(71) Applicant: Samsung Electronics Co., Ltd., Suwon-si (KR)

(72) Inventors: Jongmin Kim, Suwon-si (KR); Ho-Ju Song, Suwon-si (KR); Myeong-Dong Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 379 days.

(21) Appl. No.: 18/469,791

(22) Filed: Sep. 19, 2023

(65) Prior Publication Data

US 2024/0324181 A1 Sep. 26, 2024

(30) Foreign Application Priority Data

Mar. 22, 2023 (KR) ........................ 10-2023-0037508

(51) Int. Cl.
H10B 12/00 (2023.01)
H10W 20/00 (2026.01)
H10W 20/43 (2026.01)

(52) U.S. Cl.
CPC ........... H10B 12/482 (2023.02); H10B 12/03 (2023.02); H10B 12/485 (2023.02); H10W 20/056 (2026.01); H10W 20/43 (2026.01)

(58) Field of Classification Search
CPC .... H10B 12/482; H10B 12/03; H10B 12/485; H10B 12/0335; H10B 12/315; H10B 12/033; H10B 12/09; H10B 12/312; H10B 12/50; H10B 12/05; H10W 20/056; H10W 20/43; H10P 50/73
See application file for complete search history.

(56) References Cited

U.S. PATENT DOCUMENTS

| | | | |
|---|---|---|---|
| 9,202,775 B2 | 12/2015 | Jung et al. | |
| 9,871,045 B2 | 1/2018 | Yeom et al. | |
| 10,651,176 B2 | 5/2020 | Chun | |
| 10,840,249 B2 | 11/2020 | Iwaki | |
| 11,183,499 B2 | 11/2021 | Tanaka et al. | |
| 11,264,392 B2 | 3/2022 | Kim et al. | |

(Continued)

FOREIGN PATENT DOCUMENTS

CN 110534517 A 12/2019

*Primary Examiner* — S M Sohel Imtiaz
(74) *Attorney, Agent, or Firm* — Wolf, Greenfield & Sacks, P.C.

(57) ABSTRACT

A method of manufacturing a semiconductor device includes forming a buffer layer on a substrate including active regions and word lines, sequentially stacking a first conductive layer and a first insulating layer, forming bit line structure main parts such that each bit line main part is in contact with one or more of the active regions through a plurality of first contacts, by etching the first insulating layer and the first conductive layer, stacking first spacers, forming bit line structure expansions by etching the first spacers, the first insulating layer, and the first conductive layer, and forming second contacts such that the second contacts are in contact with the active regions, respectively. The bit line structure expansions are connected to the bit line structure main parts, respectively, and are wider than the bit line structure main parts as viewed in a plan view.

14 Claims, 28 Drawing Sheets

(56)         References Cited

U.S. PATENT DOCUMENTS

| | | | | |
|---|---|---|---|---|
| 2013/0049209 A1* | 2/2013 | Yeom | ................. | H10B 12/0335 |
| | | | | 257/E21.585 |
| 2013/0196477 A1* | 8/2013 | Kang | ................... | H10B 12/053 |
| | | | | 438/270 |
| 2015/0028492 A1* | 1/2015 | Jung | ................... | H10B 12/482 |
| | | | | 257/774 |
| 2015/0318286 A1* | 11/2015 | Ikeda | ..................... | H10B 12/05 |
| | | | | 438/586 |
| 2015/0340313 A1* | 11/2015 | Choi | ................... | H10B 12/315 |
| | | | | 257/773 |
| 2018/0286871 A1* | 10/2018 | Chang | ................... | H10B 12/09 |
| 2018/0350818 A1* | 12/2018 | Yoon | ................... | H10B 12/315 |
| 2019/0304983 A1* | 10/2019 | Chun | ................. | H10B 12/482 |
| 2019/0393226 A1* | 12/2019 | Tanaka | ................ | G11C 11/4097 |
| 2020/0066731 A1* | 2/2020 | Iwaki | ..................... | H10B 12/50 |
| 2020/0402981 A1* | 12/2020 | Kim | ................. | H10B 12/0335 |
| 2021/0098460 A1* | 4/2021 | Lee | ...................... | H10B 12/315 |
| 2021/0210493 A1* | 7/2021 | Kim | ................... | H10B 12/315 |
| 2022/0028859 A1* | 1/2022 | Hong | ................. | H10B 12/482 |
| 2022/0122990 A1* | 4/2022 | Liu | ........................ | H10B 12/34 |
| 2022/0336464 A1 | 10/2022 | Ahn et al. | | |
| 2023/0018552 A1* | 1/2023 | Wang | ................... | H10B 12/05 |
| 2023/0413536 A1* | 12/2023 | Shao | ................. | H10D 30/6735 |
| 2024/0298434 A1* | 9/2024 | Dou | ....................... | H10B 12/05 |

* cited by examiner

FIG. 6

SEMICONDUCTOR DEVICE AND MANUFACTURING METHOD THEREOF

CROSS-REFERENCE TO RELATED APPLICATION

This application claims priority under 35 U.S.C. § 119 to and the benefit of Korean Patent Application No. 10-2023-0037508 filed in the Korean Intellectual Property Office on Mar. 22, 2023, the entire contents of which are incorporated herein by reference.

BACKGROUND

The described technology relates generally to a semiconductor device and a manufacturing method thereof.

As the degrees of integration of semiconductor devices, for example, semiconductor memory devices, have increased, circuits have become finer (i.e., more dense). Accordingly, the design rules have decreased, which have made the fabrication processes increasingly more complicated.

SUMMARY

The described technology has been made in an effort to reduce defects in a semiconductor device and improve the performance.

A manufacturing method of a semiconductor device according to an embodiment includes a step of forming a buffer layer on a substrate including a plurality of active regions and a plurality of word lines, a step of sequentially stacking a first conductive layer and a first insulating layer, a step of forming a plurality of bit line structure main parts such that each bit line main part is in contact with one or more of the active regions through a plurality of first contacts, by etching the first insulating layer and the first conductive layer, a step of stacking first spacers, a step of forming a plurality of bit line structure expansions by etching the first spacers, the first insulating layer, and the first conductive layer, and a step of forming a plurality of second contacts such that the second contacts are in contact with the plurality of active regions, respectively, wherein each of the active region includes a first part and a second part located on opposite sides with respect to a word line, and each of the plurality of bit line structure main parts is in contact with one or more of the first parts of the active regions and the first contacts, and each of the plurality of second contacts is in contact with the second part of one of the active regions, and the plurality of bit line structure expansions are connected to the bit line structure main parts, respectively, and are wider than the bit line structure main parts as viewed in a plan view.

A semiconductor device according to an embodiment includes a substrate, word lines located in the substrate, active regions located in the substrate, a buffer layer that is located on the substrate and has first contact holes exposing the active regions, first contacts that are in contact with the active regions through the first contact holes, bit line structures that are located on the buffer layer, and include first conductive layers which are in contact with the first contacts, bit line spacers that cover the side surfaces of the bit line structures, and second contacts that are in contact with the active regions, wherein the active regions include first parts and second parts located on opposite sides with respect to the word lines, and the first contacts are in contact with the first parts of the active regions, and the second contacts are in contact with the second parts of the active regions, and the bit line structures includes main parts extending long, and expansions which are connected to ends of the main parts and are wide, and the bit line spacers include the main-part spacers including first spacers, second spacers, and third spacers arranged sequentially from the side surfaces of the main parts, and expansion spacers including fourth spacers and fifth spacers arranged sequentially from the side surfaces of the expansions.

By the above-mentioned configurations, it is possible to reduce damage to the bit lines.

BRIEF DESCRIPTION OF THE DRAWINGS

FIG. 6 is a drawing illustrating cross sections of the semiconductor device of FIG. 5 taken along lines A-A, B-B, and C-C.

DETAILED DESCRIPTION

Figure 1:
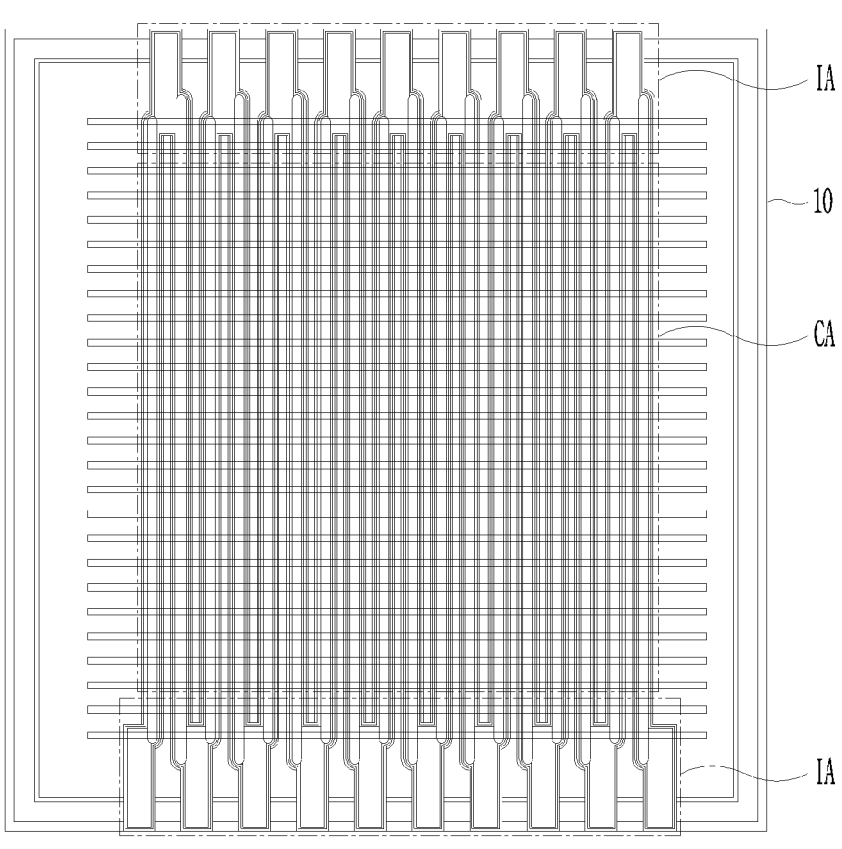
FIG. 1 is a schematic layout diagram of an example semiconductor device according to an embodiment.

In the following detailed description, only certain embodiments have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the several views of the drawings and in the specification.

Although the accompanying drawings relate to a dynamic random access memory (DRAM), the present invention is not limited thereto.

Figure 2:
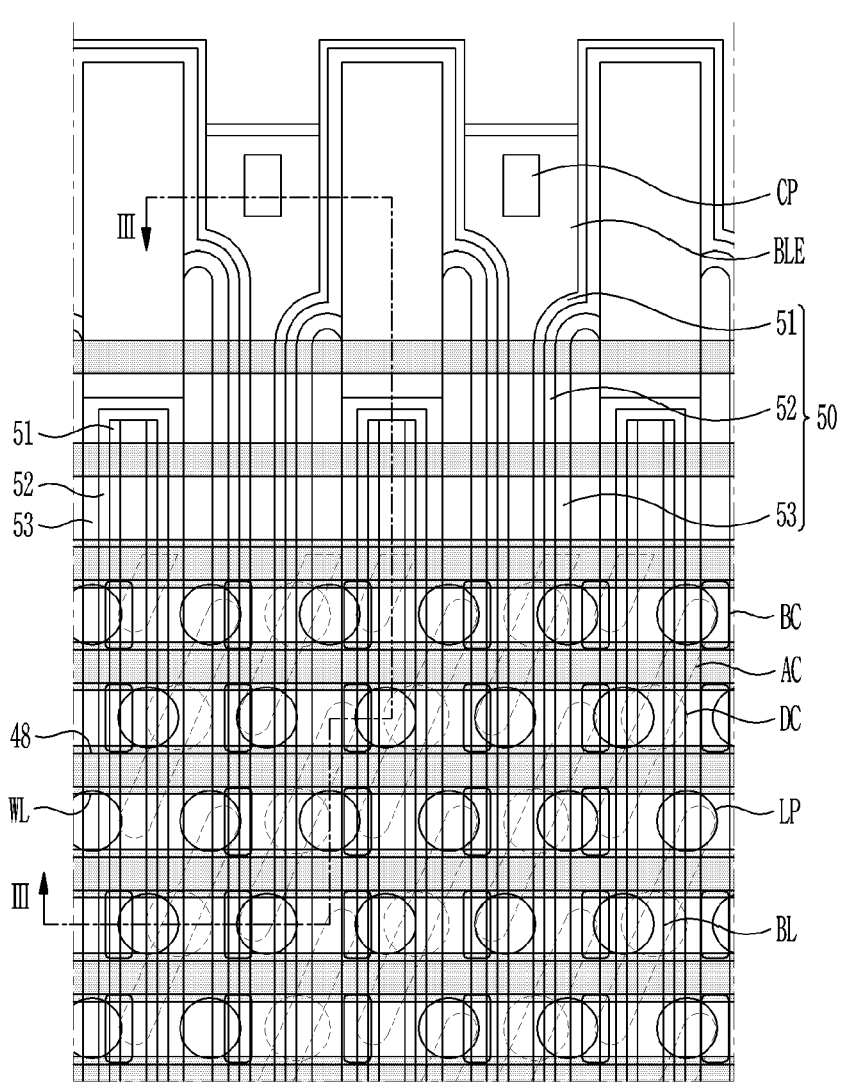
FIG. 2 is an example of an enlarged view of a part of the semiconductor device shown in FIG. 1.
Figure 3:
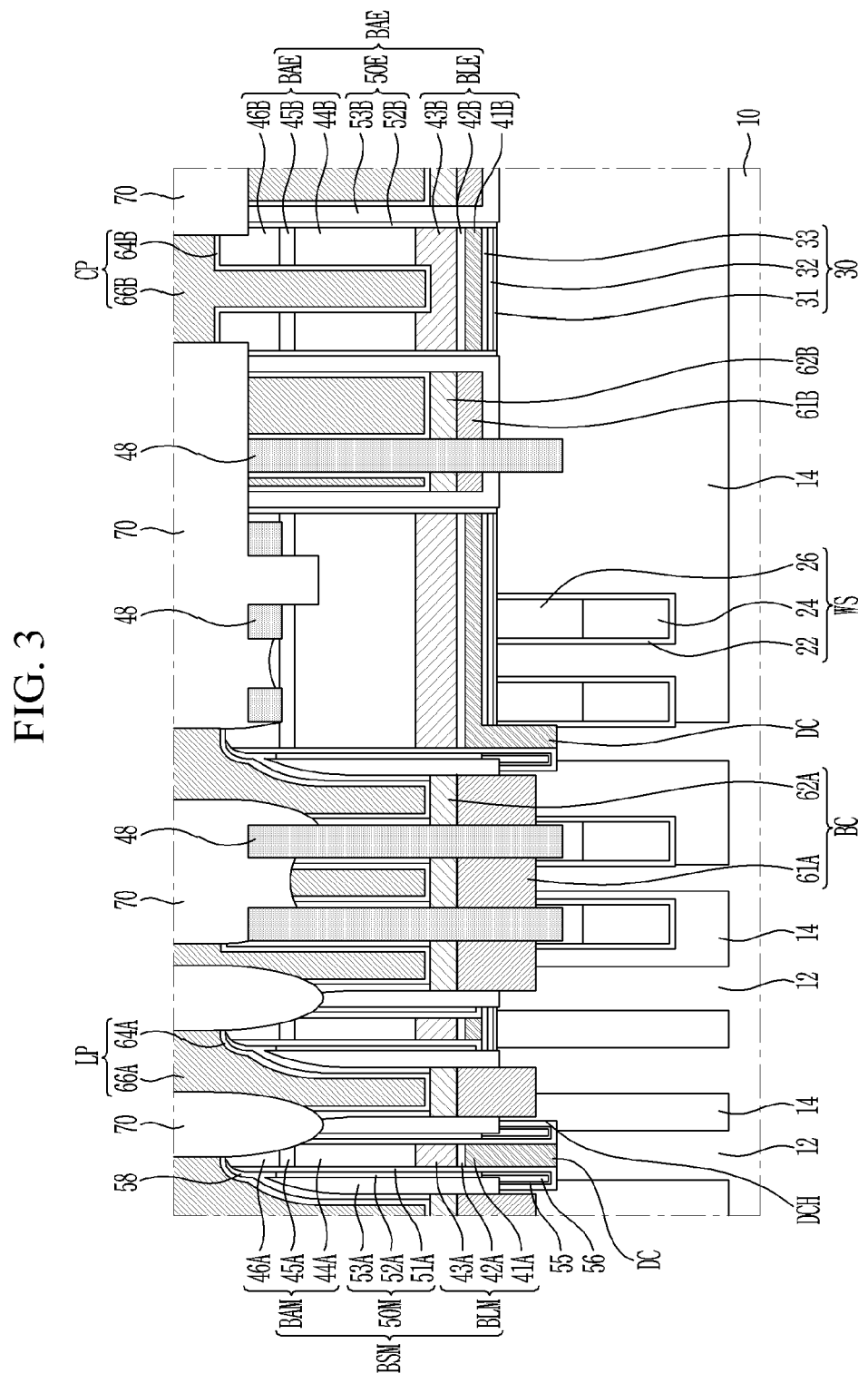
FIG. 3 is an example of a cross-sectional view of the semiconductor device shown in FIG. 2 as taken along line III-III.

FIG. 1 is a schematic layout diagram, in top plan view, of at least a portion of an example semiconductor device according to an embodiment, and FIG. 2 is an example of an enlarged view of a part of the semiconductor device shown in FIG. 1, and FIG. 3 is an example of a cross-sectional view of the semiconductor device shown in FIG. 2 as taken along line III-III.

Referring to FIG. 1, the semiconductor device according to the embodiment may include a substrate 10, and the substrate 10 may include a cell array area CA and interface areas IA The interface areas IA may be disposed around the cell array area CA. The term "around" (or similarly "surround" or "surrounding") as used herein is not intended to require that the particular region or area (e.g., interface areas IA) entirely encircle or enclose another region or area (e.g., cell array CA). For instance, FIG. 1 shows an example in which two interface areas IA are disposed on two end sides of the cell array area CA; however, the embodiment is not limited thereto.

Referring to FIG. 2, the semiconductor device according to the embodiment may include a plurality of word lines WL, a plurality of bit lines BL, and a plurality of active regions AC.

The plurality of word lines WL may extend, for example, in a transverse direction, for example, in parallel with one another, at regular intervals. The width of the word lines WL and the interval between the word lines WL may be determined depending on design rules.

The bit lines BL may intersect with the word lines WL, for example, at a right angle. For example, when the word lines WL extend in the transverse direction, the bit lines BL may extend in the longitudinal direction. The plurality of bit lines BL may be disposed in parallel with one another at regular intervals.

The word lines WL and the bit lines BL are electrically insulated from one another. For example, the word lines WL and the bit lines BL may intersect with each other with an insulating layer interposed therebetween, and at the intersections, the bit lines BL may be located on the word lines WL (in plan view). However, the vertical relationship between the word lines WL and the bit lines BL is not limited thereto.

The word lines WL and the bit lines BL may intersect with each in the cell array area CA, thereby defining cells, and extend along outwardly beyond the cell array area CA for electrical connection with the outside.

For example, the bit lines BL may extend deep into the interface areas IA, and when the interface areas IA are located on two end sides of the cell array area CA, the odd-numbered bit lines BL and the even-numbered bit lines BL may extend in opposite directions. For example, the odd-numbered bit lines BL may extend to one of the interface areas IA, and the even-numbered bit lines BL may extend to the other interface area IA. However, the form in which the word lines WL and the bit lines BL extend is not limited thereto.

The end parts of each of at least a subset of the bit lines BL may be expanded so as to have a larger area relative to other parts of the bit line BL, and may be connected to contact plugs CP for electrical connection with the outside. Hereinafter, the wide end parts of the bit lines BL will also be referred to as the "bit line expansions" BLE, and the other parts will also be referred to as the bit line main parts BLM.

The widths of the word lines WL and the bit lines BL, the interval between the word lines WL, the interval between the bit lines BL, etc., may be determined according to the design rules.

The plurality of active regions AC may be located in the cell array area CA. Each active region AC may intersect with a word line WL with an insulating layer interposed therebetween, and be connected to bit lines BL. Each active region AC may also be connected to a capacitor (not explicitly shown in the drawings, but implied). Through this structure, a transistor may be formed so as to have a channel in an active region AC. In this case, the word line WL serves as the gate electrode, and parts of the active region AC located on both sides of the word line WL serve as source/drain regions.

According to the embodiment, each active region AC may have a relatively long island shape having a short axis and a long axis, for example, a bar shape long in a diagonal or oblique direction as shown in FIG. 2. This shape is just due to a decrease in the design rules of the semiconductor device, and the shape of the active regions AC according to the embodiment is not limited thereto.

According to an embodiment, each active region AC may intersect with two word lines WL and be connected to one bit line BL. In this case, the active region AC may be divided into three parts with the word line WL as a boundary, and the middle part may be connected to the bit line BL through a direct contact DC, and both end parts may be connected to a capacitor (not explicitly shown in the drawings) through buried contacts BC and landing pads LP.

The direct contact DC may overlap the bit line BL and the active region AC (in plan view) and be in contact with them, and may be located in the center of the active region AC. It is to be appreciated that the term "overlap" as used herein is not intended to require a complete overlap of an area or structure over another area or structure. The buried contacts BC may overlap both end parts of the active region AC and be connected to them, and may be located in a space defined by partitions 48 extending along in the transverse direction and the bit lines BL extending in the longitudinal direction. The partitions 48 may completely overlap the word lines WL in the cell array area CA, and may be narrower than the word lines WL.

The landing pads LP may overlap the buried contacts BC and be in contact with them, and may be mainly located in the spaces between adjacent word lines WL. Each landing pad LP may also be in contact with one electrode of a capacitor (not explicitly shown in the drawings). The landing pads LP are introduced in view of the small areas of the buried contacts BC in the layout structure, in order to increase the actual contact areas between the buried contacts BC and the capacitor electrodes, thereby reducing the contact resistances. However, the embodiment is not limited thereto, and the landing pads LP may be omitted in some embodiments.

According to the embodiment, the direct contacts DC of the odd-numbered bit lines BL and the direct contacts DC of the even-numbered bit lines BL may be arranged so as to form a staggered pattern, and the landing pads LP may also be arranged so as to form a staggered pattern. In this way, it is possible to efficiently utilize a small area.

However, the embodiment is not limited thereto, and may have various other arrangements.

The word lines WL, the bit lines BL, the active regions AC, the direct contacts DC, the buried contacts BC, the landing pads LP, etc., described above may be implemented with various structures on the substrate 10.

Referring to FIG. 3, the semiconductor device according to the embodiment may include the substrate 10. The substrate 10 may be a silicon substrate or SOI (silicon-on-insulator). Alternatively, the substrate 10 may contain silicon germanium, SGOI (silicon-germanium-on-insulator), indium antimonide, a lead tellurium compound, indium arsenide, indium phosphide, gallium arsenide, or gallium antimonide, but is not limited thereto.

Active regions 12 may be defined by region partition layers 14 formed in the substrate 10. In other words, parts of the substrate 10 without the region partition layers 14 may become the active regions 12. The active regions 12 are located in the cell array area CA, and correspond to the reference symbol 'AC' in FIG. 2.

The region partition layers 14 may occupy a predetermined depth from the surface of the substrate 10 and extending vertically downward (i.e., perpendicular to a plane defining the surface of the substrate 10), and may be formed in an STI (shallow trench isolation) structure by forming trenches in the surface of the substrate 10 to a predetermined depth and filling the trenches with an insulating material. The term "fill" (or similarly "filling," "filled," or the like) as may be used herein is intended to refer broadly to either completely filling a defined space or partially filling the defined space; that is, the defined space need not be entirely filled but may, for example, be partially filled or have voids or other spaces throughout.

Although it is shown in FIG. 3 that the upper surfaces of the region partition layers 14 are at a level with the upper surface of the substrate 10 (i.e., coplanar), this is merely for ease of explanation, and the embodiment is not limited thereto.

The region partition layers 14 may contain silicon oxide (SiOx), silicon nitride (SiNx), silicon oxynitride (SiON), a combination thereof, etc., but are not limited thereto. Although it is shown in FIG. 3 that each region partition layer 14 is shown as a single layer in FIG. 3, this is merely for ease of explanation, and the embodiment is not limited thereto. Depending on the width, each of the region partition layers 14 may be formed of one insulating layer, or may be formed of a plurality of insulating layers.

The word lines WL according to the embodiment may be of a buried type. Word line structures WS in FIG. 3 are formed in the substrate 10 and relate to the word lines WL. The word line structures WS intersect with the region partition layers 14 and the active regions 12. The word line structures WS may include word lines 24, and gate insulating layers 22 and word line capping layers 26 surrounding them.

The word line structures WS may be formed in trenches which are formed in the substrate 10.

Referring to FIG. 3, the gate insulating layers 22 may be formed thinly along the curved surfaces (i.e., sidewalls and bottom) of the trenches so as to cover the surfaces. However, the embodiment is not limited thereto. The term "cover" (or "covering" or other like terms) as used herein is intended to refer to a material, layer or structure being on or over another material, layer or structure, but does not require the material, layer or structure to entirely cover the other material, layer or structure. Thus, for example, a material or layer having openings or holes therein may still be considered to cover another material or layer.

The gate insulating layers 22 may contain at least one of, for example, silicon oxide, silicon nitride, silicon oxynitride, and high-dielectric constant materials having dielectric constants higher than that of silicon oxide. The high-dielectric constant materials may contain at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The word lines 24 may be located on the gate insulating layers 22, and may fill the lower spaces in the trenches. The word lines 24 may be formed of a single layer, or may be formed of multiple layers.

The word lines 24 may contain at least one of, for example, metals, metal alloys, conductive metal nitride, conductive metal carbonitride, conductive metal carbide, metal silicides, impurity-containing semiconductor materials, conductive metal oxynitride, and conductive metal oxide. The word lines 24 may contain at least one of, for example, TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and combinations thereof.

The word line capping layers 26 may be disposed on the word lines 24, and may fill the upper spaces in the trenches. Although it is shown in FIG. 3 that the gate insulating layers 22 cover the entire side walls of the trenches, the gate insulating layers 22 may cover the lower parts of the side walls of the trenches and the upper parts of the side walls may be in contact with the word line capping layers 26.

The word line capping layers 26 may contain at least one of, for example, silicon nitride (SiN), silicon oxynitride (SiON), silicon oxide (SiO$_2$), silicon carbonitride (SiCN), silicon oxycarbonitride (SiOCN), and combinations thereof.

At least a part of each word line structure WS may overlap an active region 12.

On the substrate 10 including the active regions 12, the region partition layers 14, and the word line structures WS, a buffer layer 30 may be formed. The buffer layer 30 may have direct contact holes (i.e., openings) DCH, buried contact holes, etc., exposing the active regions 12 in the cell array area CA together with other structures.

As shown in FIG. 3, the buffer layer 30 may be a multi-layer structure or laminate including a lower insulating layer 31, an intermediate insulating layer 32, and an upper insulating layer 33. For example, the lower insulating layer 31 may contain silicon oxide, and the intermediate insulating layer 32 may contain metal oxide, and the upper insulating layer 33 may contain silicon nitride; however, the embodiment is not limited thereto. Unlike in the drawing, the buffer layer 30 may be a double layer including a silicon oxide layer and a silicon nitride layer; however, it is not limited thereto and may be a single insulating layer or a laminate of four or more insulating layers.

The bit lines BL according to the embodiment may be a stacked type made by stacking layers on the substrate 10, and may include the bit line main parts BLM and the bit line expansions BLE connected thereto as shown in FIG. 3.

In the embodiment, the bit lines BL may comprise multilayers. For example, each bit line BL may include a lower conductive layer 41A or 41B, an intermediate conductive layer 42A or 42B, and an upper conductive layer 43A or 43B sequentially stacked (i.e., in a vertical direction). However, the bit lines BL are not limited thereto, and may include, for example, a single conductive layer, a double conductive layer, or a laminate of four or more conductive layers.

Each of the lower conductive layers 41A and 41B, the intermediate conductive layers 42A and 42B, and the upper conductive layers 43A and 43B may contain at least one of, for example, impurity-containing semiconductor materials, conductive silicide compounds, conductive metal nitride, metals, and metal alloys. For example, the lower conductive layers 41A and 41B may contain an impurity-containing semiconductor material (for example, polysilicon, etc.), and the intermediate conductive layers 42A and 42B may contain at least one of conductive silicide compounds and conductive metal nitride, and the upper conductive layers 43A and 43B may contain at least one of metals and metal alloys; however, the embodiment is not limited thereto.

The bit lines BL may be connected to the active regions 12 through the direct contacts DC.

The direct contacts DC may be formed in the direct contact holes DCH formed in the buffer layer 30 and the active regions 12, and their upper surfaces may be in contact with the bit lines BL, and their lower surfaces may be in contact with the active regions 12. The direct contacts DC may be formed of the same material as that of the lower surfaces of the bit lines BL, in order to reduce contact resistance with the bit lines BL.

When the bit lines BL comprise multi-layers, the lowermost layers may be connected to the active regions 12 through the direct contacts DC. In the embodiment, for example, referring to FIG. 3, the direct contacts DC may be parts of the bit lines BL, particularly, the lower conductive layers 41A located at the bottoms of the bit line main parts BLM.

The direct contacts DC may not be in contact with the side walls of the direct contact holes DCH, and there may be spaces between the side surfaces of the direct contacts DC and the side walls of the direct contact holes DCH, and this space may be filled with insulating spacers. For example, referring to FIG. 3, the space between the side wall of a direct contact hole DCH and the side surface of a direct contact DC may be filled with three layers of spacers, that is, an inner spacer 51A, a lower filling spacer 55, and an upper filling spacer 56. The inner spacer 51A may be formed thinly while conforming to the contact surfaces, so as to cover the side wall and bottom surface of the direct contact hole DCH and the side surface of the direct contact DC. The lower filling spacer 55 may be formed thinly while conforming to the contact surface, so as to cover the inner spacer 51A. The upper filling spacer 56 may fill the remaining empty space in the direct contact hole DCH. However, the embodiment is not limited thereto, and for example, the lower filling spacer 55 may be omitted.

The upper surfaces of the bit lines BL may be covered by bit line capping layers, and the bit line capping layers may include capping layer main parts BAM located on the bit line main parts BLM, and capping layer expansions BAE located on the bit line expansions BLE. Hereinafter, for convenience, the capping layer main parts BAM and the capping layer expansions BAE will be referred to collectively as the "bit line capping layers BA". The bit line capping layers BA may serve for reducing damage to the bit lines BL in the processes after formation of the bit lines BL. The bit line capping layers BA may contain at least one of, for example, silicon nitride, silicon oxynitride, silicon carbonitride, and silicon oxycarbonitride.

As shown in FIG. 3, the bit line capping layers BA may have a triple-layer structure. For example, the bit line capping layers BA may include lower insulating layers 44A and 44B, intermediate insulating layers 45A and 45B, and upper insulating layers 46A and 46B. Each of the lower insulating layers 44A and 44B, the intermediate insulating layers 45A and 45B, and the upper insulating layers 46A and 46B may contain at least one of, for example, silicon nitride, silicon oxynitride, silicon carbonitride, and silicon oxycarbonitride.

Although it is shown in FIG. 3 that each bit line capping layer BA is formed of three layers, the embodiment is not limited thereto. Unlike in the drawing, each bit line capping layer BA may be formed of a single layer, two layers, or four or more layers.

The bit lines BL and the bit line capping layers BA may have substantially the same planar shape, and may be formed using the same mask.

In this specification, hereinafter, the bit lines BL and the bit line capping layers BA will be referred to collectively as the "bit line structures BS", the bit line main parts BLM and the capping layer main parts BAM will also be referred to collectively as the "bit line structure main parts BSM", and the bit line expansions BLE and the capping layer expansions BAE will also be referred to collectively as the "bit line structure expansions BSE".

On both sides of each bit line structure BS, bit line spacers (reference symbol "50" in FIG. 2) may be formed. According to the embodiment, for example, referring to FIG. 2, the bit line spacers 50 extend in the longitudinal direction along the bit lines BL (or the bit line structures BS). The bit line spacers 50 may contain at least one of, for example, silicon oxide, silicon nitride, silicon oxynitride (SiON), silicon oxycarbonitride (SiOCN), air, and combinations thereof, but are not limited thereto.

The bit line spacers 50 according to the embodiment may include a plurality of layers. For example, referring to FIG. 2 and FIG. 3, while both side surfaces of each bit line structure main part BSM are covered by main-part spacers 50M which include three layers of spacers 51A, 52A, and 53A, both side surfaces of each bit line structure expansions BSE are covered by expansion spacers 50E which include only two layers of spacers 52B and 53B.

The main-part spacers 50M may include inner spacers 51A, intermediate spacers 52A, and outer spacers 53A arranged sequentially from the sides close to the bit line structure main parts BSM. Among them, the inner spacers 51A are in contact with the bit line structure main parts BSM, and extend along the direct contacts DC so as to cover the side walls and bottom surfaces of the direct contact holes DCH as described above. The intermediate spacers 52A may extend up to the upper surface of the buffer layer 30 and the upper boundaries of the direct contact holes DCH, and the outer spacers 53A may extend below the upper boundaries of the direct contact holes DCH.

The expansion spacers 50E may include intermediate spacers 52B and outer spacers 53B. The intermediate spacers 52B of the expansion spacers 50E may correspond to the intermediate spacers 52A of the main-part spacers 50M. For example, the intermediate spacers 52B of the expansion spacers 50E and the intermediate spacers 52A of the main-part spacers 50M may be connected to each other (reference symbol "52" in FIG. 2). Therefore, the intermediate spacers 52B of the expansion spacers 50E may contain the same material as that of the intermediate spacers 52A of the main-part spacers 50M, and have substantially the same thickness as that of the main-part spacers. The outer spacers 53B of the expansion spacers 50E may correspond to the outer spacers 53A of the main-part spacers 50M. For example, the outer spacers 53B of the expansion spacers 50E may be connected to the outer spacers 53A of the main-part spacers 50M (reference symbol "52" in FIG. 2). Therefore, the outer spacers 53B of the expansion spacers 50E may contain the same material as that of the outer spacers 53A of the main-part spacers 50M, and the thickness of the outer spacers 53B of the expansion spacers 50E may be equal to or smaller than the thickness of the outer spacers 53A of the main-part spacers 50M. The outer spacers 53B of the expansion spacers 50E according to the embodiment may be thicker than the outer spacers 53A of the main-part spacers 50M are, since the outer spacers 53A of the main-part spacers 50M are removed by a thickness in the middle of the manufacturing process.

The expansion spacers 50E do not include parts corresponding to the inner spacers 51A of the main-part spacers 50M. Therefore, the intermediate spacers 52B of the expansion spacers 50E are in contact with the side surfaces of the bit line structure expansions BSE. Further, the outer spacers 53B may cover the surfaces of the parts of the substrate 10 between the bit line structure expansions BSE.

Referring to FIG. 1 to FIG. 3, the partitions 48 may extend along in the transverse direction so as to intersect with the bit line structure main parts BSM and the main-part spacers 50M. In the cell array area CA, the partitions 48 may completely overlap the word line structures WS and be narrower than the word line structures WS. In other words, the upper and lower boundaries of the partitions 48 may overlap the insides (i.e., edges) of the word line structures WS. The partitions 48 in the interface areas IA may be omitted.

The parts of the partitions 48 located in the spaces between the main-part spacers 50M may extend deep into the substrate 10, particularly, into the word line capping layers 26 in the cell array area CA. In the parts where the partitions 48 and the bit line structure main parts BSM overlap, the partitions 48 may coincide with a location of the bit line structure main parts BSM, and the height of the bit line structure main parts BSM may be relatively low. FIG. 3 shows that in the parts of the capping layer main parts BAM located beneath the partitions 48, there are no upper insulating layers 46A and some upper parts of the intermediate insulating layers 45A have been removed. However, the embodiment is not limited thereto. The upper surfaces of the partitions 48 may be lower than the upper surfaces of the highest parts of the bit line structure main parts BSM, but are not limited thereto. The partitions 48 may contain at least one of, for example, silicon oxide, silicon nitride, silicon oxynitride, and combinations thereof, but are not limited thereto.

The buried contacts BC may be located in the spaces defined by the partitions 48 and the main-part spacers 50M in the cell array area CA, and overlap the end parts of the active regions 12. At least some parts of the buried contacts BC may be buried in the substrate 10. For example, the lower surfaces of the buried contacts BC may be lower than the upper surface of the substrate 10, and may be higher than the lower surfaces of the partitions 48. The upper surfaces of the buried contacts BC may be lower than the upper surfaces of the partitions 48, and, for example, may be higher than the upper surface of the substrate 10, but are not limited thereto.

According to the embodiment, the buried contacts BC may include lower layers 61A and upper layers 62A. The lower layers 61A may contain at least one of, for example, impurity-containing semiconductor materials, conductive silicide compounds, conductive metal nitride, and metals. The lower layers 61A may contain, for example, impurity-containing polysilicon, and the impurity may be, for example, one or more of phosphorus, arsenic, boron, and combinations thereof. The upper layers 62A may contain metal silicide.

Referring to FIG. 1 and FIG. 2, in the spaces defined by the partitions 48 and either the main-part spacers 50M or the expansion spacers 50E in the interface areas IA, conductive isolation layers 61B and 62B having a structure similar to that of the buried contacts BC may be located. According to the embodiment, the lower surfaces of the conductive isolation layers 61B and 62B may be located on the outer spacers 53B of the expansion spacers 50E. The conductive isolation layers 61B and 62B may include lower layers 61B and upper layers 62B, which may contain the same material as that of the lower layers 61A and the upper layers 62A of the buried contacts BC. According to another embodiment, the conductive isolation layers may include only the lower layers 61B. In this case, the upper surfaces of the conductive isolation layers may be higher than the upper surfaces of the buried contacts BC. The conductor of the conductive isolation layer may be replaced with an insulator.

On the side surfaces of the main-part spacers 50M and the partitions 48 defining the buried contacts BC, cell spacers 58 are formed. The cell spacers 58 may extend up to the upper surfaces of the buried contacts BC.

The landing pads LP may be formed on the buried contacts BC so as to be in contact with the buried contacts BC. The landing pads LP may overlap some parts of the upper surfaces of the bit line structure main parts BSM.

The contact plugs CP are located at the centers of the bit line structure expansions BSE, and pass through the capping layer expansions BAE so as to be in contact with the bit line expansions BLE.

Even on the conductive isolation layers 61B and 62B, structures similar to the landing pads LP and the contact plugs CP may be formed.

Referring to FIG. 3, the landing pads LP may include conductive barrier layers 64A and conductive layers 66A sequentially stacked (i.e., in the vertical direction), and the contact plugs CP may include conductive barrier layers 64B and conductive layers 66B sequentially stacked. The conductive barrier layers 64A and 64B may be formed of, for example, Ti, TiN, or laminates of Ti and TiN. The conductive layers 66A and 66B may contain, for example, at least one of impurity-containing semiconductor materials, conductive silicide compounds, conductive metal nitride, conductive metal carbide, metals, and metal alloys.

A pad separation insulating layer 70 separates the landing pads LP and the contact plugs CP, and encroaches on the bit line structures BS, the bit line spacers 50, the cell spacers 58, etc.

The pad separation insulating layer 70 may contain an insulating material, and electrically disconnect the plurality of landing pads LP from one another. For example, the pad separation insulating layer 70 may contain, for example, at least one of silicon oxide, silicon nitride, silicon oxynitride, silicon oxycarbonitride, and silicon carbonitride.

Now, a method of manufacturing the semiconductor device according to the embodiment will be described in detail with reference to FIG. 4 to FIG. 28.

Figure 9:
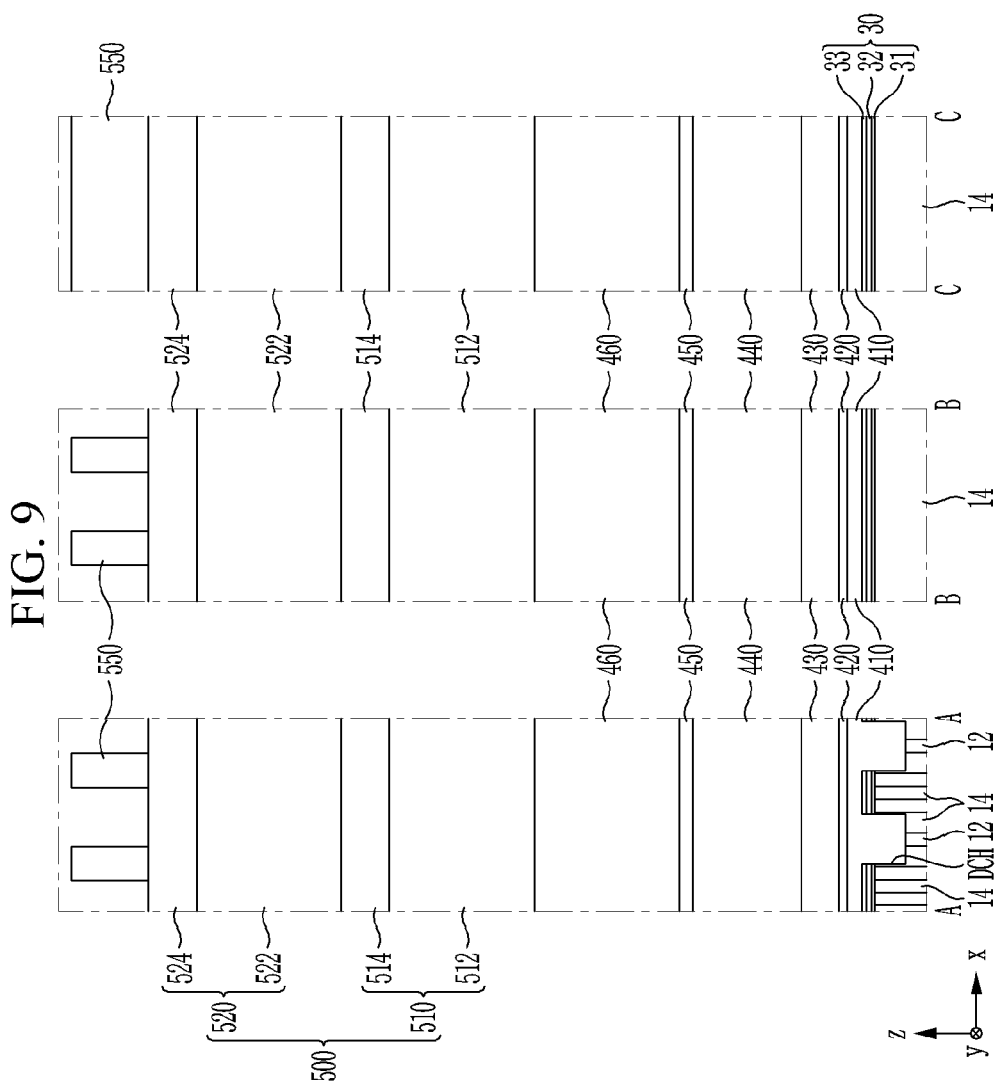
FIG. 9 and FIG. 10 are drawings illustrating cross sections of the semiconductor device of FIG. 8 taken along lines A-A, B-B, and C-C, according to the example process sequence.
Figure 10:
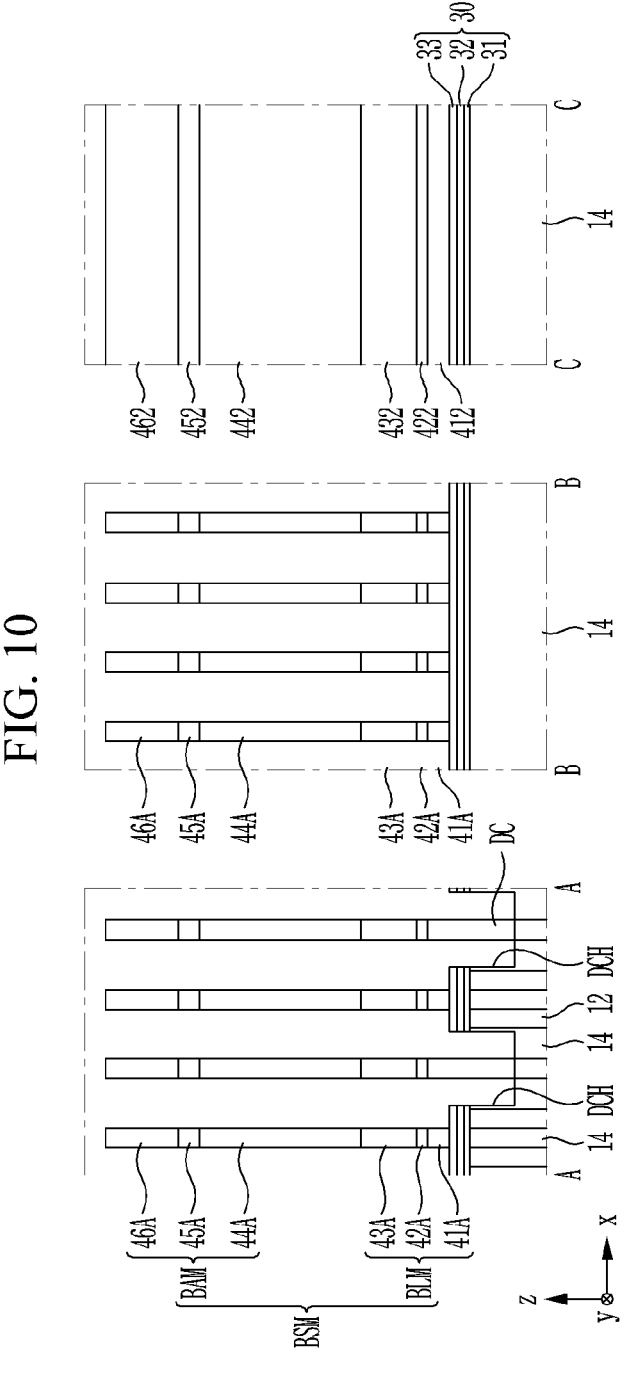
Figure 16:
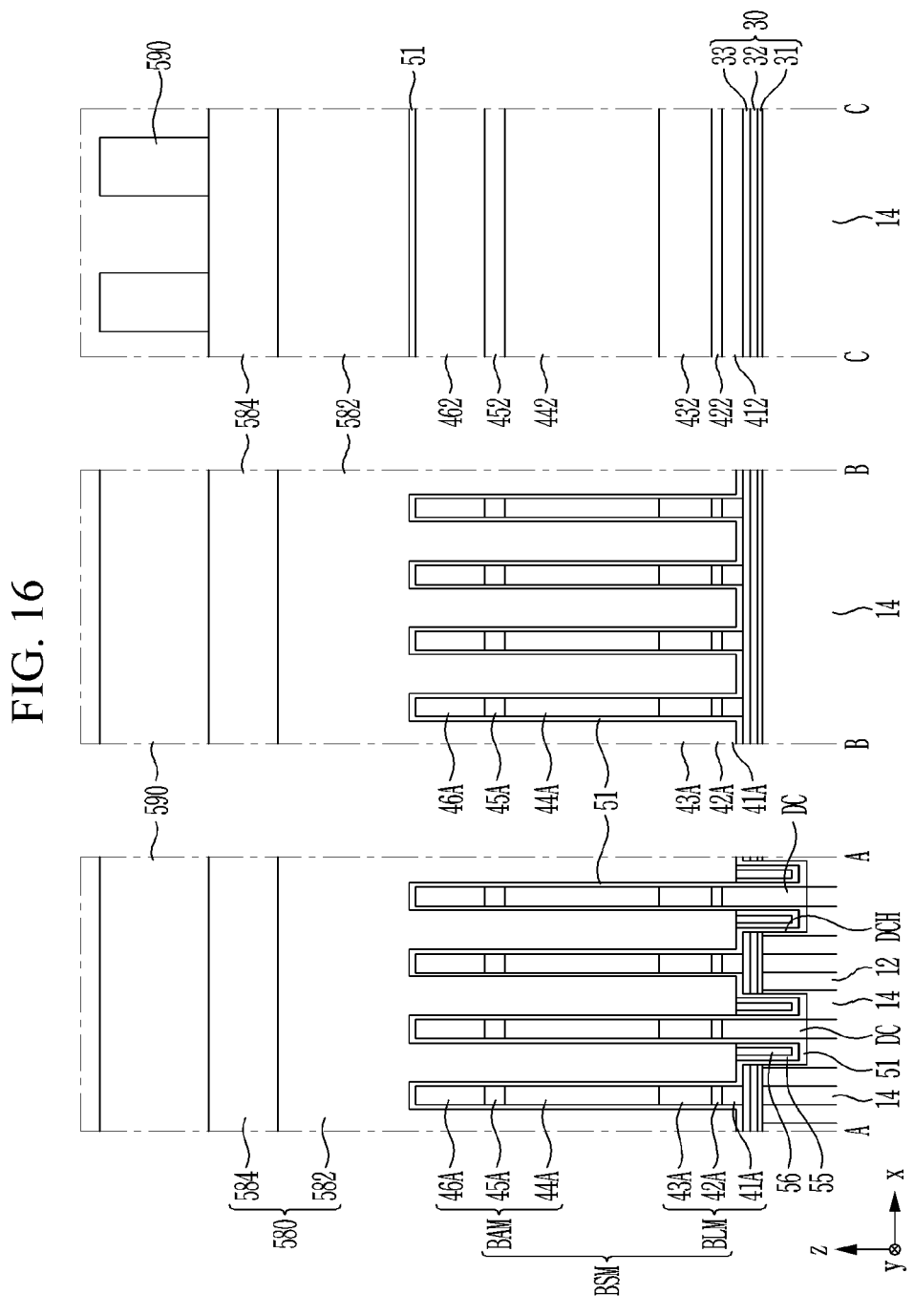
FIG. 16 and FIG. 17 are drawings illustrating cross sections of the semiconductor device of FIG. 15 taken along lines A-A, B-B, and C-C, according to the example process sequence.
Figure 17:
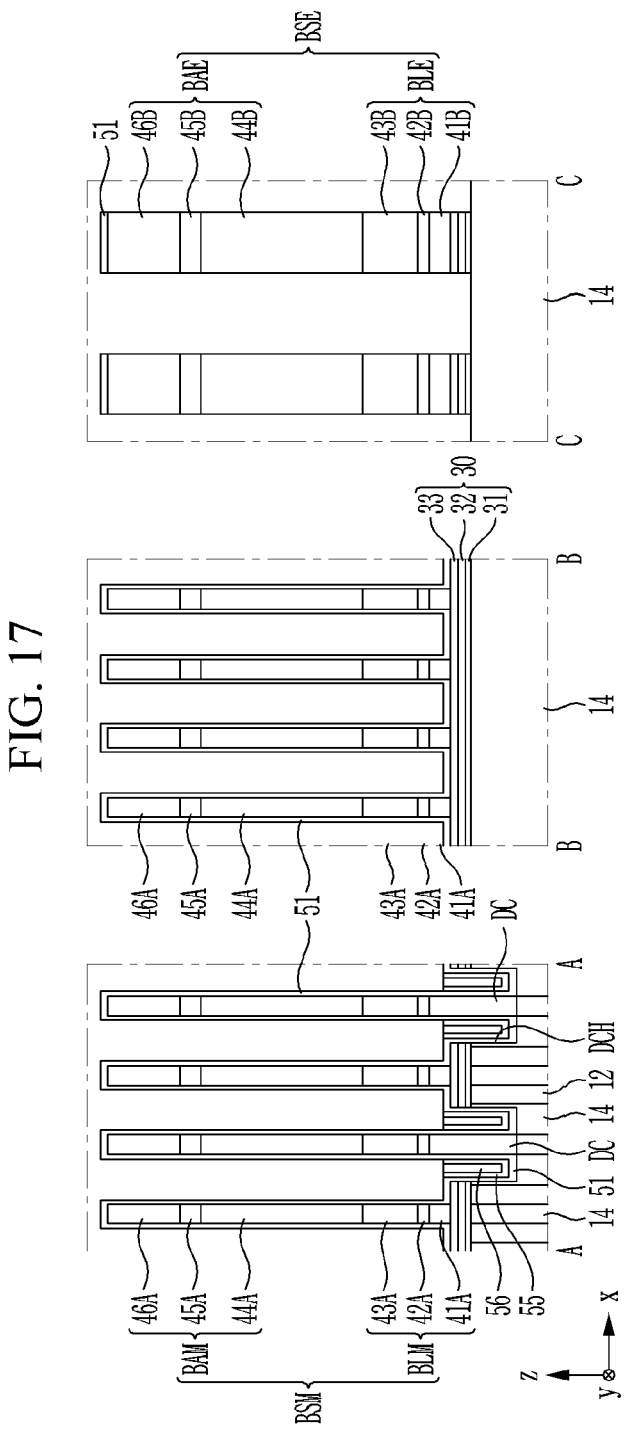
Figure 18:
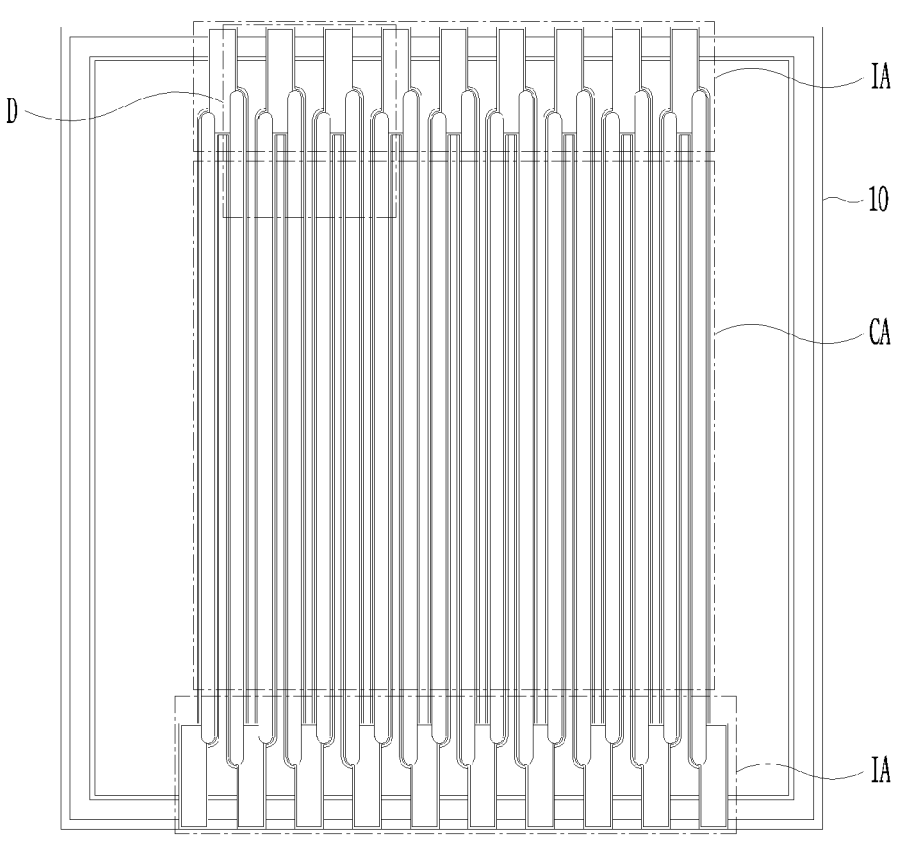
Figure 19:
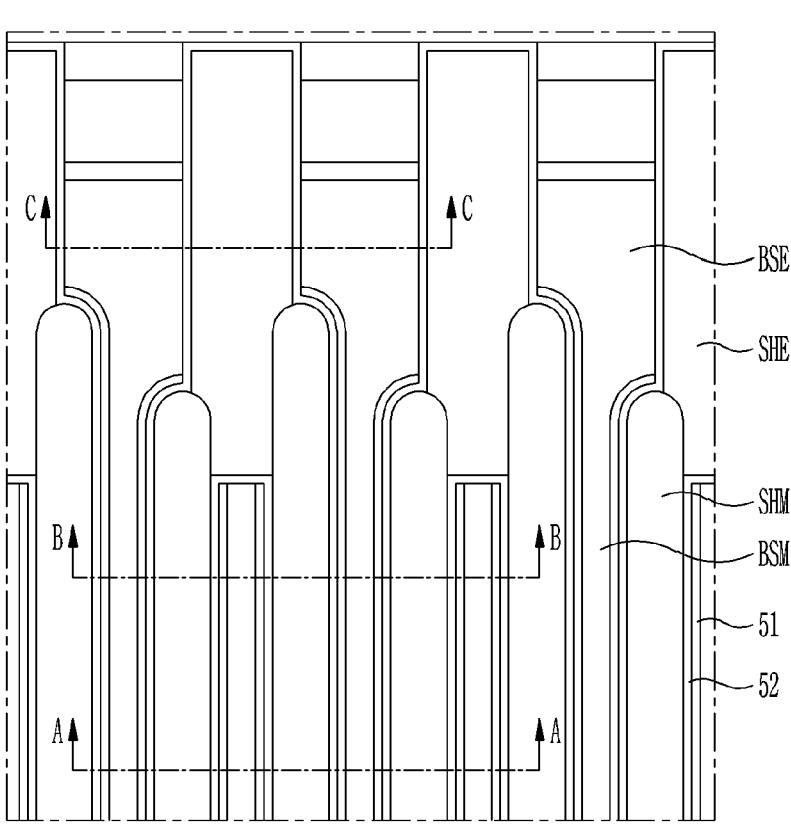
Figure 20:
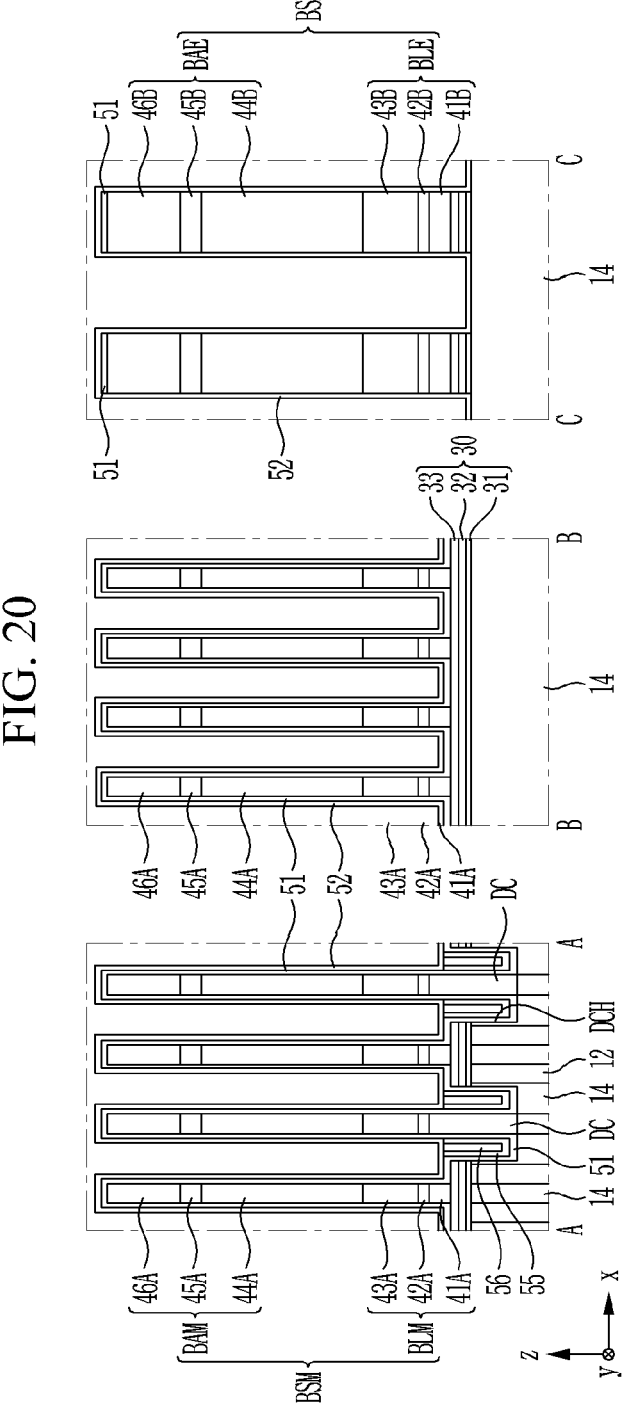
FIG. 20 and FIG. 21 are drawings illustrating cross sections of the semiconductor device of FIG. 19 taken along lines A-A, B-B, and C-C, according to the example process sequence.
Figure 21:
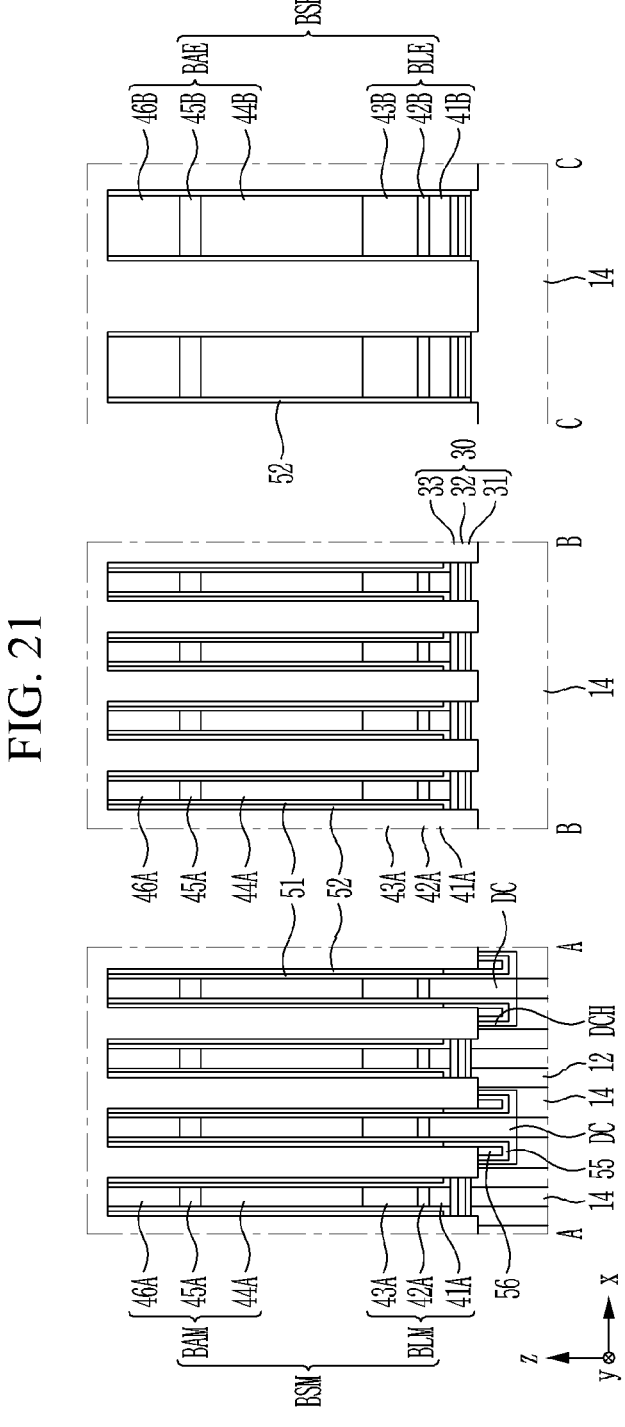
Figure 22:
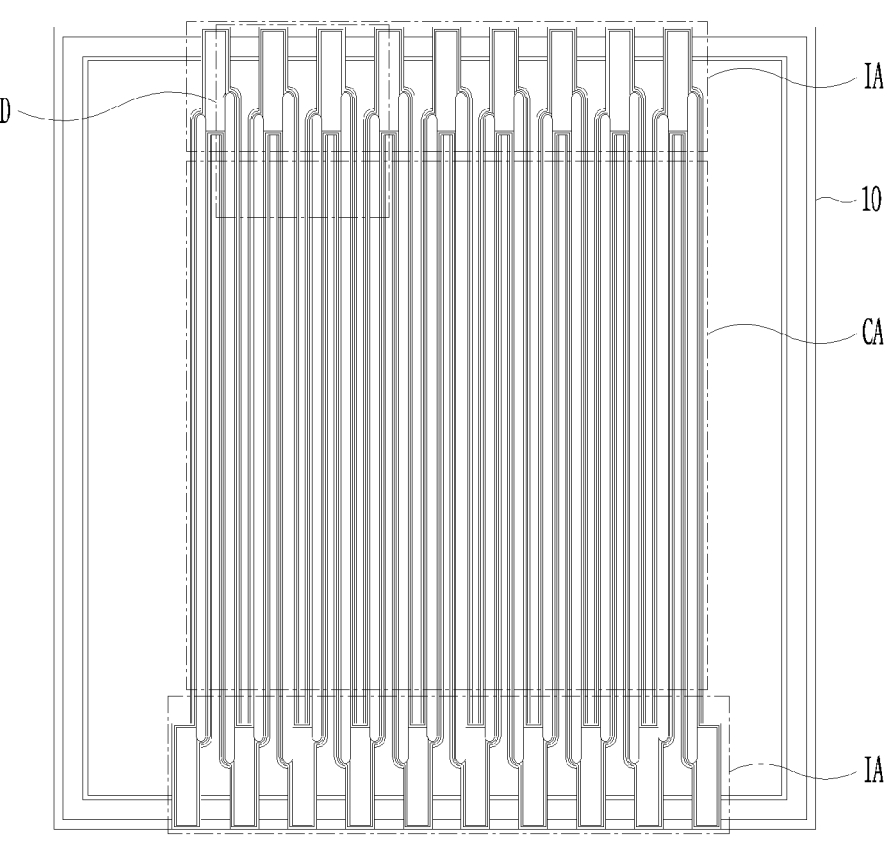
Figure 23:
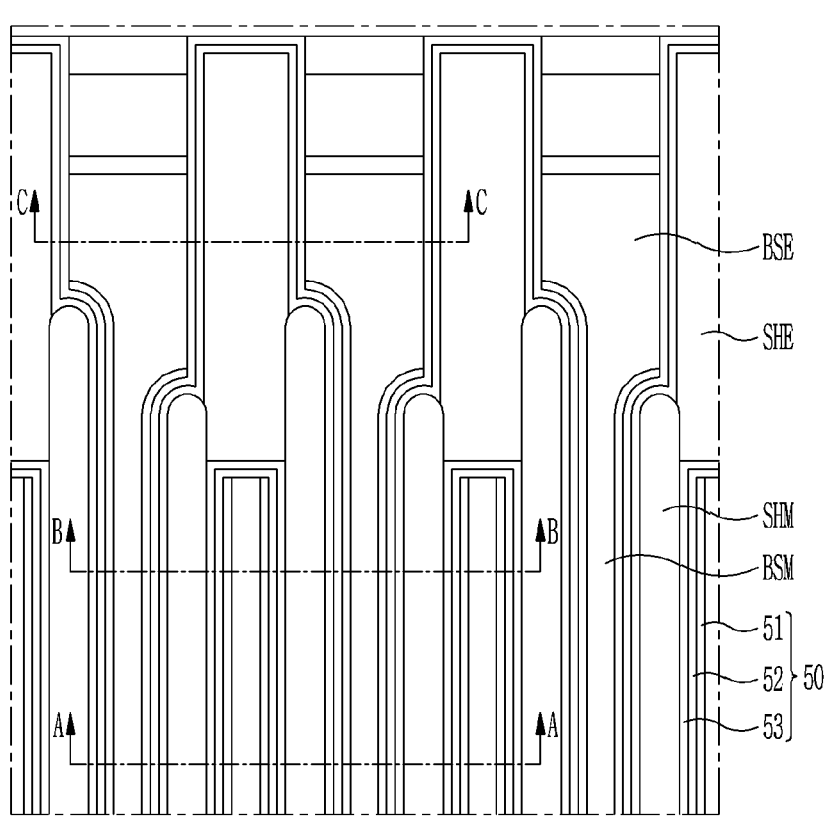
Figure 24:
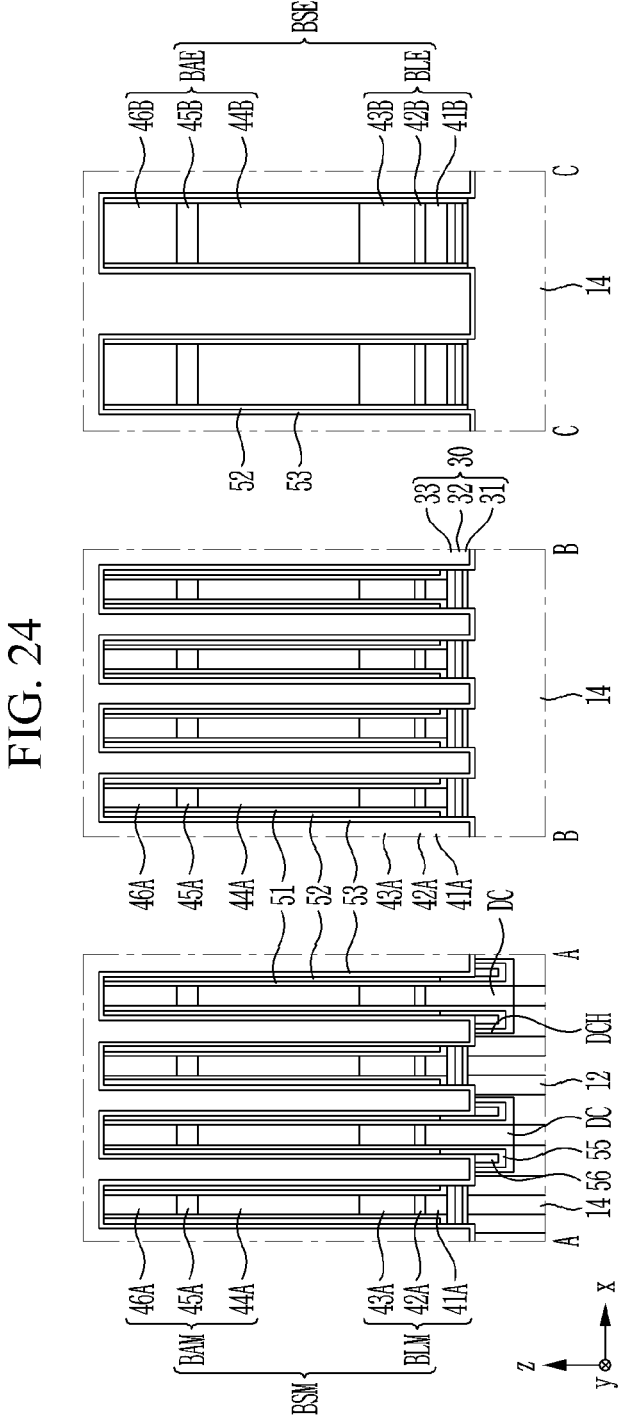
FIG. 24 to FIG. 28 are drawings illustrating cross sections of the semiconductor device of FIG. 23 taken along lines A-A, B-B, and C-C, according to the example process sequence.

FIG. 4, FIG. 7, FIG. 11, FIG. 14, FIG. 18, and FIG. 22 are schematic layout diagrams depicting example intermediate processes in the manufacture of the semiconductor device according to the embodiment, and FIG. 5, FIG. 8, FIG. 12, FIG. 15, FIG. 19, and FIG. 23 are enlarged views of parts D in FIG. 4, FIG. 7, FIG. 11, FIG. 14, FIG. 18, and FIG. 22, respectively. FIG. 6 is a drawing illustrating cross sections of the semiconductor device of FIG. 5 taken along lines A-A, B-B, and C-C, and FIG. 9 and FIG. 10 are drawings illustrating cross sections of the semiconductor device of FIG. 8 taken along lines A-A, B-B, and C-C, according to the process sequence, and FIG. 13 is a drawing illustrating cross sections of the semiconductor device of FIG. 12 taken along lines A-A, B-B, and C-C, and FIG. 16 and FIG. 17 are drawings illustrating cross sections of the semiconductor device of FIG. 15 taken along lines A-A, B-B, and C-C, according to the process sequence, and FIG. 20 and FIG. 21 are drawings illustrating cross sections of the semiconductor device of FIG. 19 taken along lines A-A, B-B, and C-C, according to the process sequence, and FIG. 24 to FIG. 28 are drawings illustrating cross sections of the semiconductor device of FIG. 23 taken along lines A-A, B-B, and C-C, according to the process sequence.

Some constituent elements which are formed in the cell array area CA may be formed simultaneously with some constituent elements which are formed in the interface areas IA.

Figure 4:
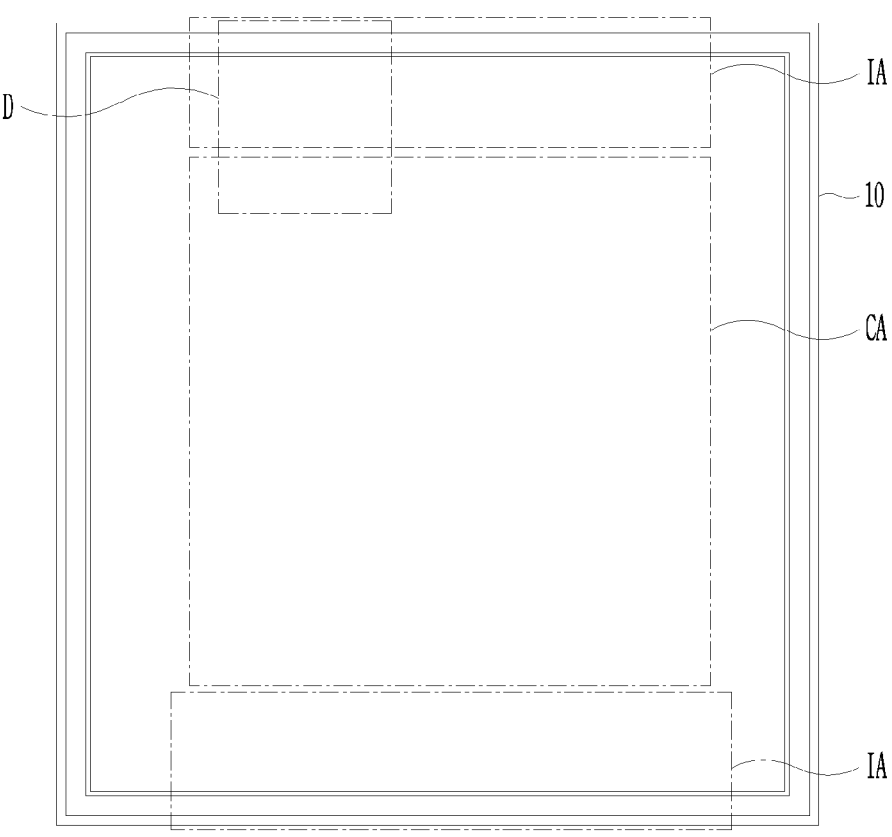
FIG. 4, FIG. 7, FIG. 11, FIG. 14, FIG. 18, and FIG. 22 are schematic layout diagrams depicting example intermediate processes in the manufacture of the example semiconductor device according to one or more embodiments.
Figure 5:
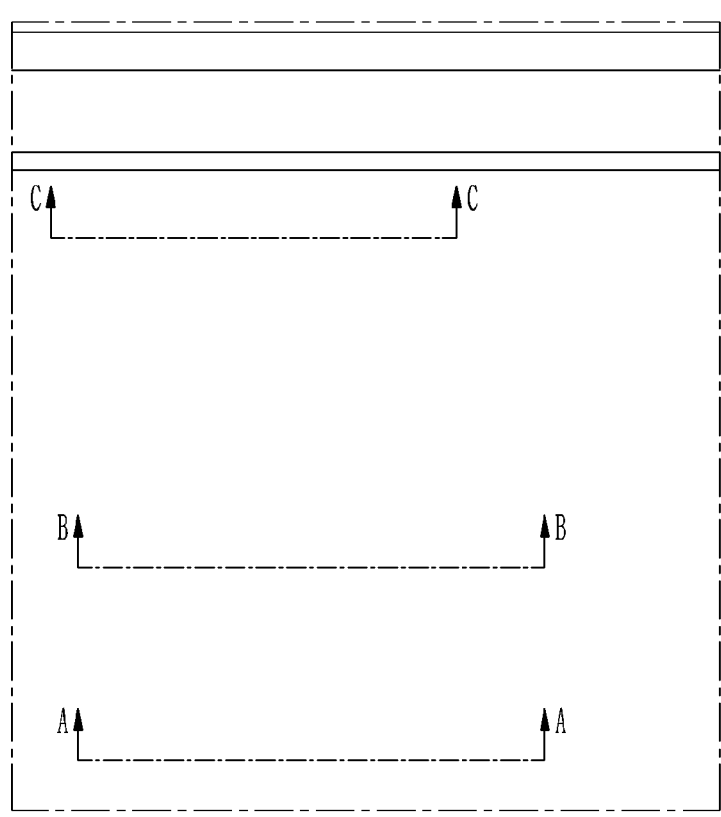
FIG. 5, FIG. 8, FIG. 12, FIG. 15, FIG. 19, and FIG. 23 are enlarged views of parts D in FIG. 4, FIG. 7, FIG. 11, FIG. 14, FIG. 18, and FIG. 22, respectively.
Figure 6:
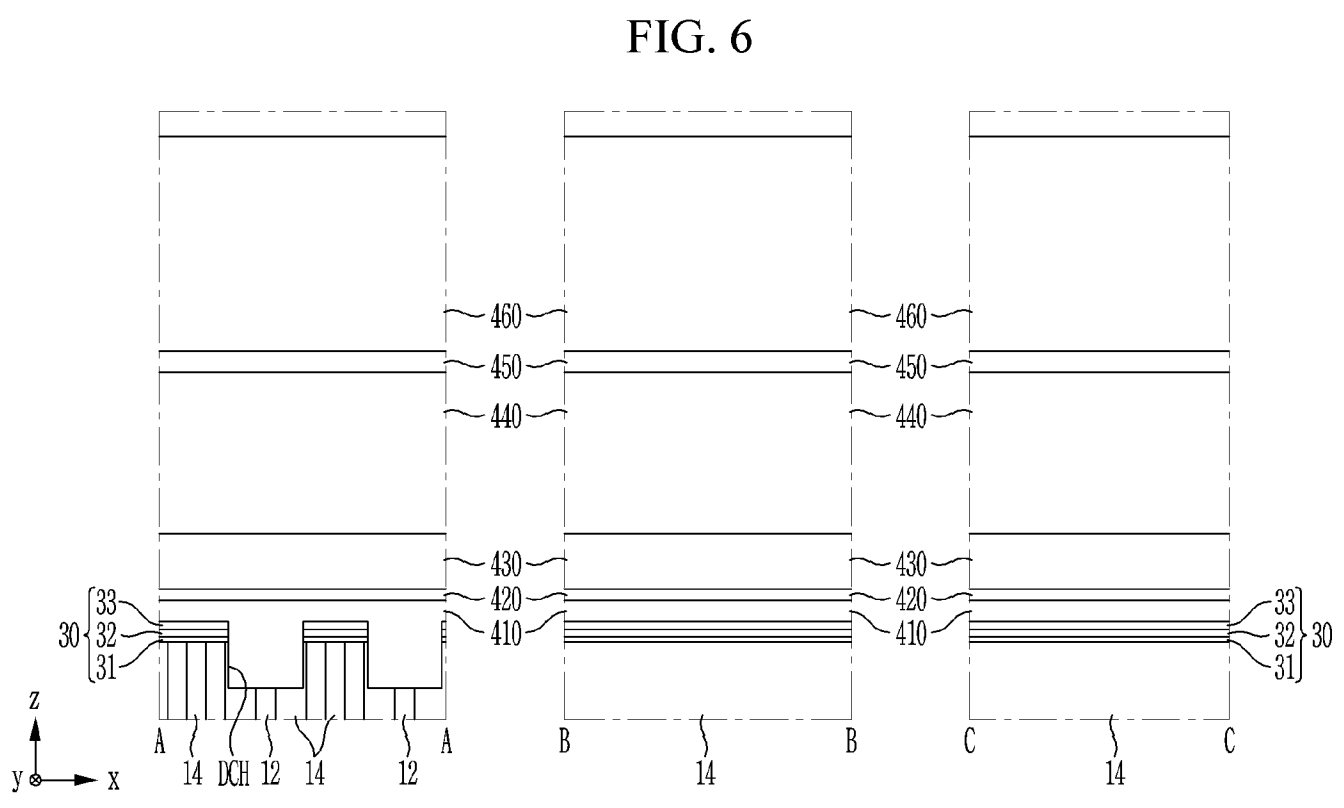

Referring to FIG. 4 to FIG. 6, on the substrate 10 having the plurality of region partition layers 14 defining the active regions 12 and the plurality of word line structures (reference symbol "WS" in FIG. 3), the buffer layer 30 is stacked, and some parts of the buffer layer 30 and the substrate 10 may be etched so as to form the plurality of direct contact holes DCH.

The region partition layers 14 may be formed in the substrate 10 through an STI (shallow trench isolation) process, although embodiments of the inventive concept are not limited thereto.

Although it is shown that the active regions 12 are arranged only in the cell array area CA, the active regions 12 may be defined even in the interface areas IA, if necessary. Referring to the cross-sectional views in FIG. 6, in the cell array area CA (FIG. 4), the active regions 12 and the region partition layers 14 are alternately arranged. According to the embodiment, after the word lines (reference symbol "WS" in FIG. 3) are formed, the active regions AC may be doped with impurities such that source/drain regions are formed. According to another embodiment, before the word lines WS are formed, doping with impurity ions may be performed to form source/drain regions.

Although it is shown in FIG. 6 that the buffer layer 30 includes three insulating layers 31, 32, and 33, the buffer layer is not limited thereto, and may include a single insulating layer, two insulating layers, or four or more insulating layers.

The plurality of direct contact holes DCH may be apart and isolated from one another and have a planer shape such as a circular shape, an elliptical shape, a rectangular shape, etc., but are not limited thereto.

Subsequently, three conductive layers 410, 420, and 430 and three insulating layers 440, 450, and 460 may be formed in a sequentially stacked manner. The lower conductive layer 410 located at the lowest position (in a vertical or z-direction) may contain an impurity-containing semiconductor material, for example, polysilicon, and may fill the direct contact holes DCH. However, the embodiment is not limited thereto. For example, each of the three conductive layers 410, 420, and 430 may contain at least one of conductive silicide compounds, conductive metal nitride, metals, and/or metal alloys. According to the embodiment, the lower conductive layer 410 may contain an impurity-containing semiconductor material, and the intermediate conductive layer 420 may contain at least one of conductive silicide compounds and conductive metal nitride, and the upper conductive layer 430 may contain at least one of metals and metal alloys.

Each of the insulating layers 440, 450, and 460 may contain, for example, at least one of silicon oxide, silicon nitride, silicon oxynitride (SiON), silicon oxycarbonitride (SiOCN), and combinations thereof, but is not limited thereto.

According to another embodiment, in place of the three conductive layers 410, 420, 430, a single conductive layer, two conductive layers, or four or more conductive layers may be used, and in place of the three insulating layers 440, 450, and 460, a single insulating layer, two insulating layers, or four or more insulating layers may be used.

Referring to FIG. 7 to FIG. 10, the three insulating layers 440, 450, and 460 and the three conductive layers 410, 420, and 430 are patterned so as to form the plurality of bit line structure main parts BSM.

Specifically, referring to FIG. 9, on the uppermost insulating layer 460, a hard mask stack 500 for forming the bit line structure main parts BSM is formed, and a photosensitive film 550 is formed.

The bit line structure main parts BSM may be formed, for example, through double patterning, etc. In this case, the photosensitive film 550 has half as many patterns as the bit line structure main part (BSM) patterns required to be formed, and the hard mask stack 500 may include two hard masks 510 and 520. Each of the hard masks 510 and 520 may include two layers, and for example, lower layers 512 and 522 (in the vertical or z-direction) may contain SOH and upper layers 514 and 524 may contain SiON.

However, the method of forming the bit line structure main parts BSM according to the embodiment is not limited thereto.

Next, referring to FIG. 10, the hard mask stack 500, the insulating layers 440, 450, and 460, and the conductive layers 410, 420, and 430 are etched using the photosensitive film 550 as a mask, so as to form the plurality of bit line structure main parts BSM, and the photosensitive film 550 and the hard mask stack 500 are removed, such as by ashing and stripping. During this process, some parts of the upper part of the upper insulating layer 460 may be removed, thereby becoming thinner (i.e., having a reduced cross section in the z-direction).

Figure 7:
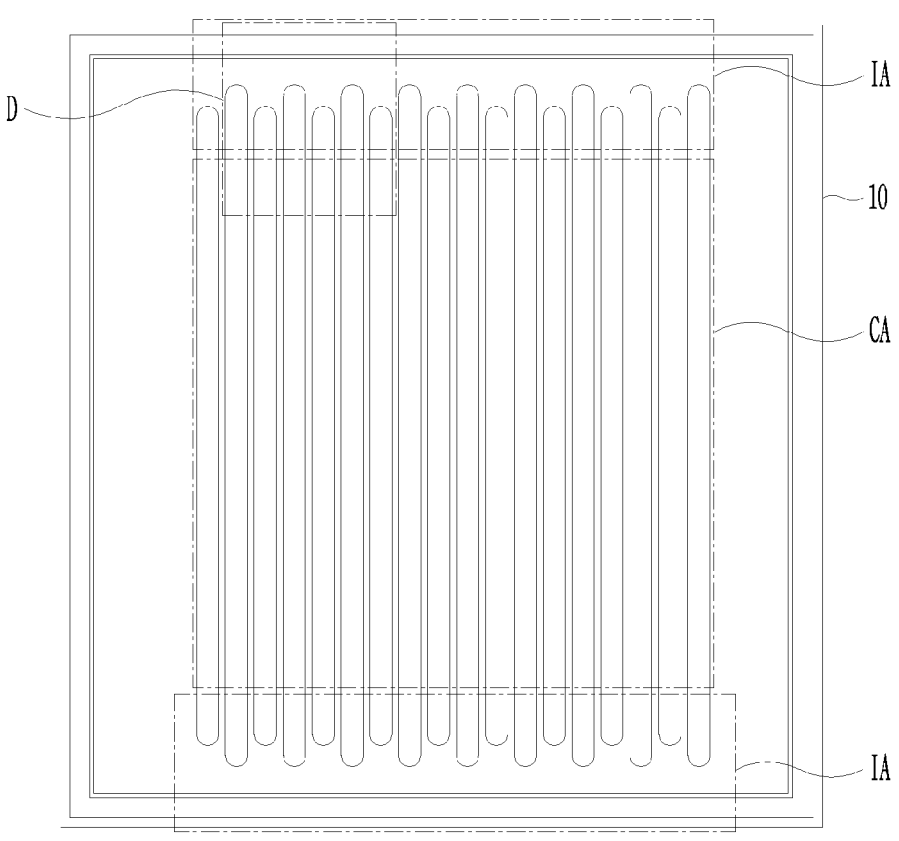
Figure 8:
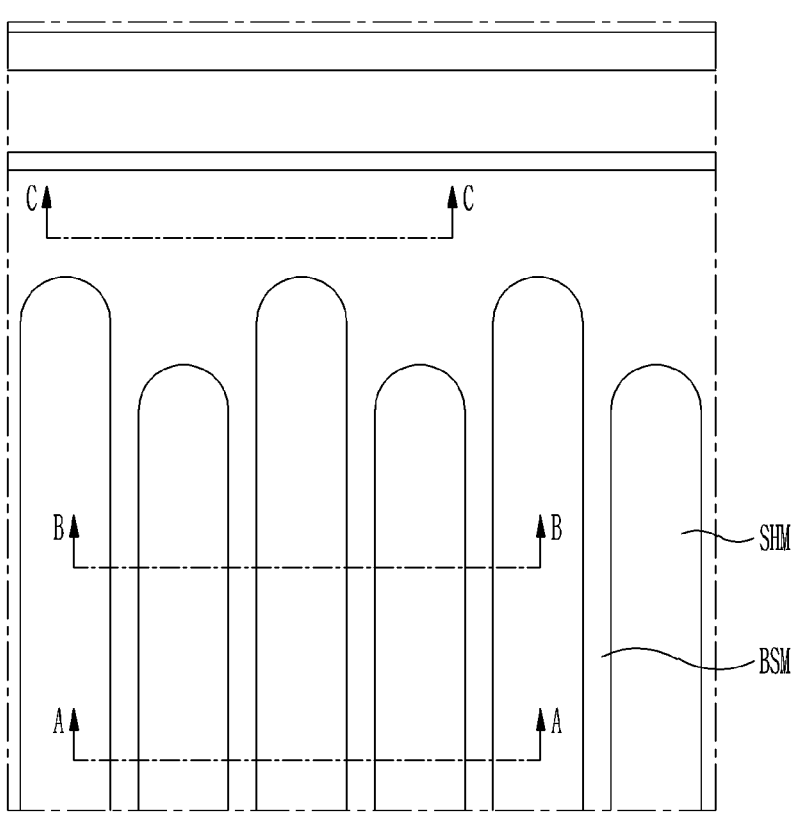

The plurality of bit line structure main parts BSM formed in the above-mentioned way may extend in the longitudinal direction (i.e., y-direction) in parallel with one another. The spaces between the bit line structure main parts BSM, or main-part separation grooves SHM may extend in the longitudinal direction in parallel with one another, similarly to the bit line structure main parts BSM, and the odd-numbered main-part separation grooves SHM and the even-numbered main-part separation groove SHM may be different from each other in their longitudinal lengths. For example, as shown in FIG. 7, the odd-numbered main-part separation grooves SHM may be shorter than the even-numbered main-part separation groove SHM are. However, the embodiment is not limited thereto, and the length of the odd-numbered main-part separation grooves SHM may be equal to or larger than the length of the even-numbered main-part separation groove SHM.

Each of the bit line structure main parts BSM includes a bit line main part BLM, and a capping layer main part BAM formed on the bit line main part. The bit line main parts BLM may include the lower, intermediate, and upper conductive layers 41A, 42A, and 43A formed from the conductive layers 410, 420, and 430, respectively, and the capping layer main parts BAM may include the lower, intermediate, and upper insulating layers 44A, 45A, and 46A formed from the insulating layers 440, 450, and 460, respectively.

The bit line structure main parts BSM may be narrower (in the x-direction) than the direct contact holes DCH. In this case, some parts of the parts of the lower conductive layer 410 filling the direct contact holes DCH may be removed, and the remaining parts may become the direct contacts DC which are parts of the lower conductive layers 41A of the bit lines BL.

Remaining parts 412, 422, 432, 442, 452, and 462 of the conductive layers 410, 420, and 430 and the insulating layers 440, 450, and 460 have frame shapes surrounding the bit line structure main parts BSM, in which two band-like parts extending in the transverse direction are connected to all of the bit line structure main parts BSM.

Figure 11:
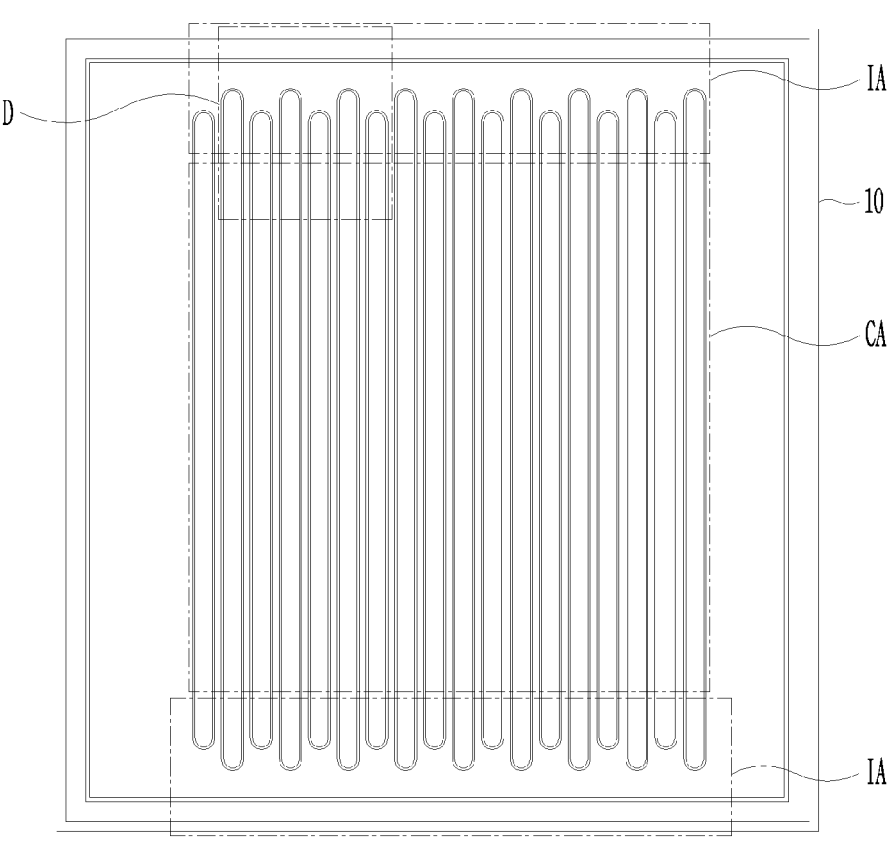
Figure 12:
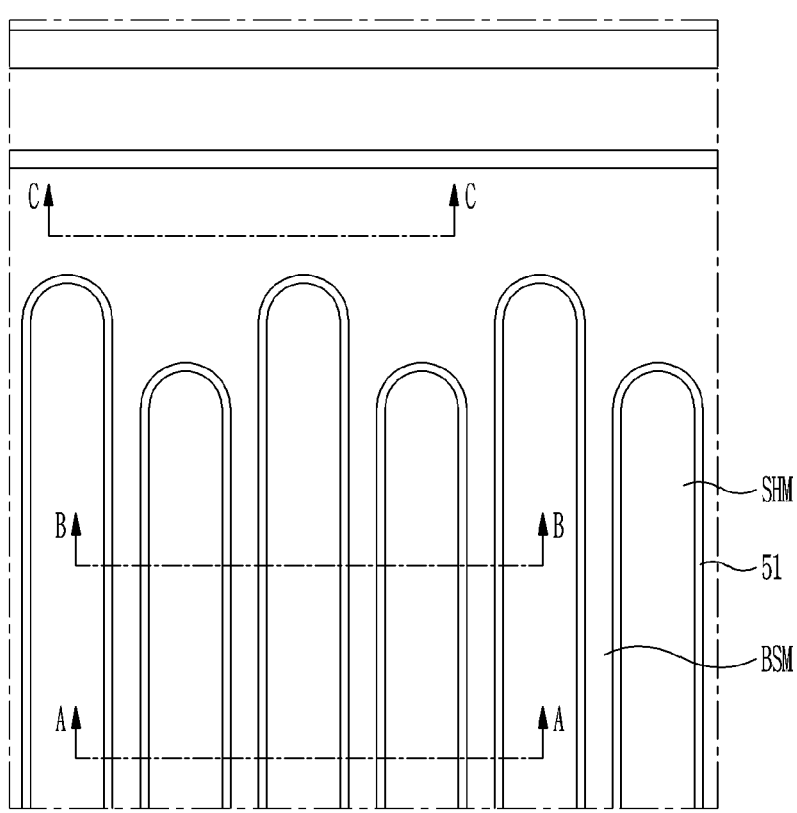
Figure 13:
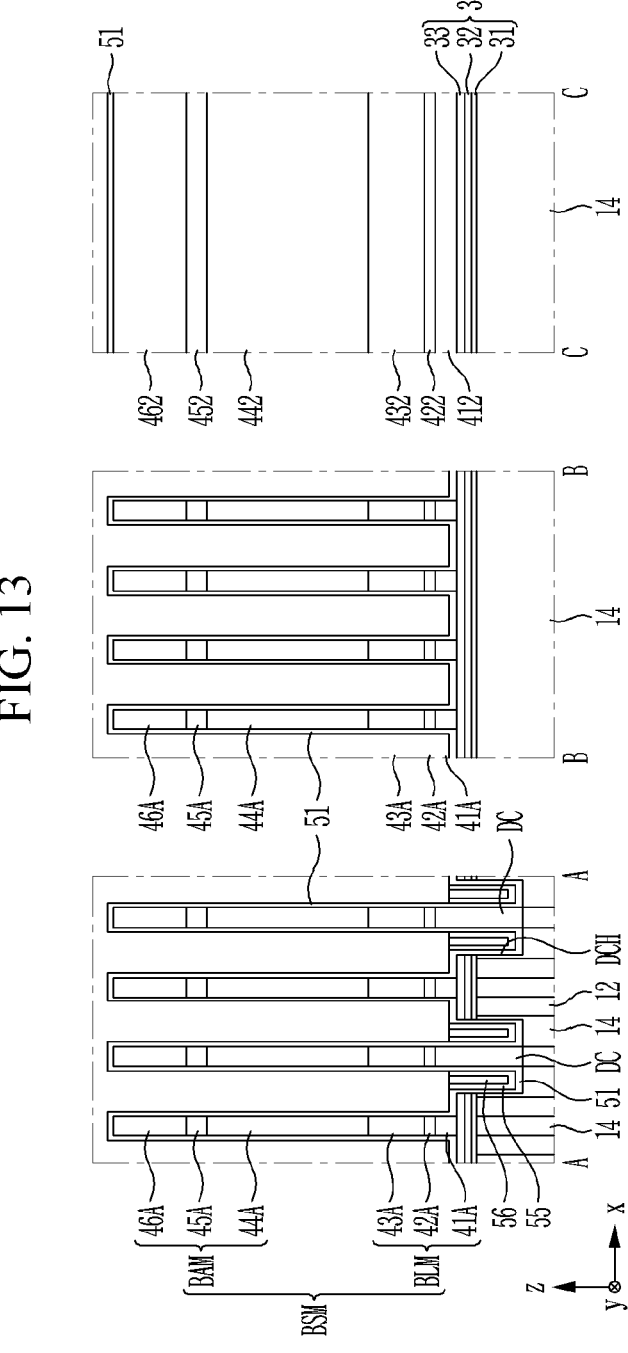
FIG. 13 is a drawing illustrating cross sections of the semiconductor device of FIG. 12 taken along lines A-A, B-B, and C-C.
Figure 14:
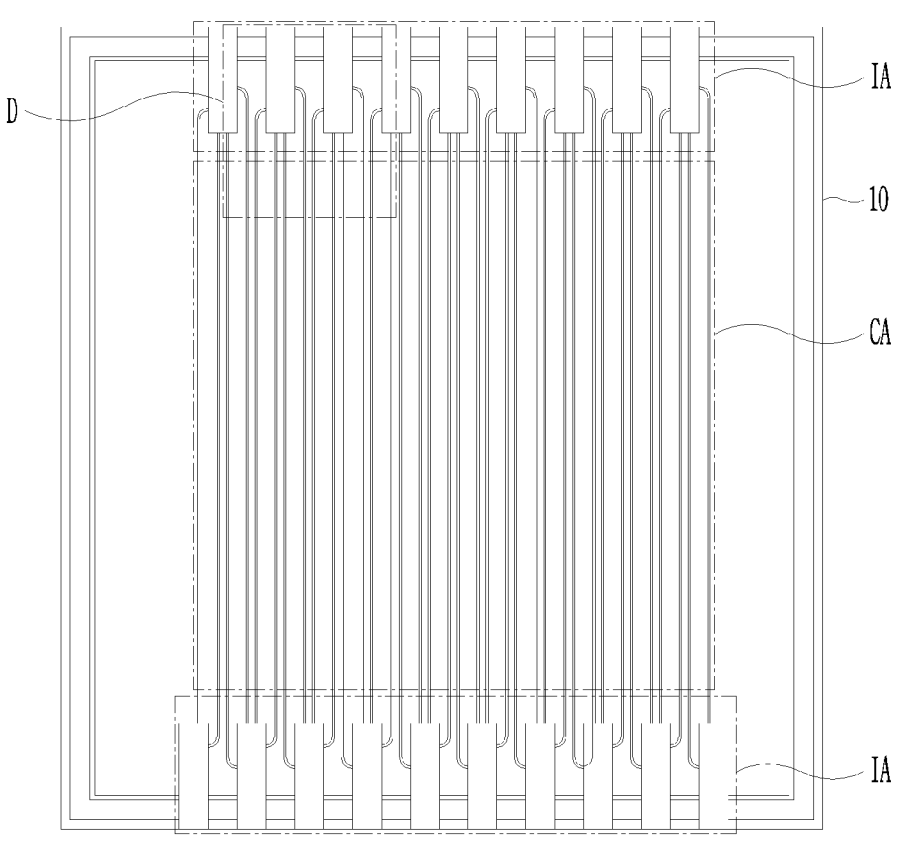

Referring to FIG. 11 to FIG. 13, after inner spacers 51 are stacked, two insulating layers are stacked and etched so as to form the filing spacers 55 and 56 filling the empty spaces in the direct contact holes DCH. The inner spacers 51 may contain silicon nitride, and the lower filling spacers 55 may contain silicon oxide, and the upper filling spacers 56 may contain silicon nitride, although embodiments are not limited thereto. The etching may be performed sequentially using, for example, hydrofluoric acid (HF) and HP as etchants.

Referring to FIG. 14 to FIG. 17, the remaining parts 412, 422, 432, 442, 452, and 462 of the conductive layers 410, 420, and 430 and the insulating layers 440, 450, and 460 are etched so as to form the bit line structure expansions BSE.

Specifically, referring to FIG. 16, a hard mask 580 for forming the bit line structure expansions BSE may be formed on the inner spacers 51, and a photosensitive film 590 is formed on an upper surface of the hard mask 580. The hard mask 580 may include two layers, and for example, a lower layer 582 may contain SOH and an upper layer 584 may contain SiON, although embodiments are limited to these materials. The bit line structure expansions BSE can be patterned by a general method without using double patterning, since they have a large size. Accordingly, the photosensitive film 590 may have as many patterns as the bit line structure expansions BSE required to be formed. However, the method of forming the bit line structure expansions BSE according to the embodiment is not limited thereto.

Subsequently, referring to FIG. 17, using the photosensitive film 590 as a mask, the hard mask 580 and the inner spacers 51 are etched, and the remaining parts 412, 422, 432, 442, 452, and 462 of the conductive layers 410, 420, and 430 and the insulating layers 440, 450, and 460 are etched, such that the remaining parts 412, 422, 432, 442, 452, and 462 are divided into the plurality of bit line structure expansions BSE. Next, the remaining photosensitive film 590 and the remaining hard mask 580 are removed, for example by ashing (i.e., plasma ashing) and stripping.

During this process, the exposed parts of the buffer layer 30 in expansion separation grooves SHE (FIG. 15) in the interface areas IA may also be removed such that the region partition layers 14 of the substrate 10 are exposed. The term "exposed" as used herein is intended as being limited to or relative to the element doing the exposing (i.e., does not require being free of other elements/layers thereon). Since the region partition layers 14 may contain oxide, when the region partition layers are etched, oxygen may be generated, and the oxygen may oxidize nearby metal layers. However, in the present embodiment, since the bit line structure main parts BSM are surrounded and protected by the inner spacers 51, the possibility that the conductive layers 41A, 42A, and 43A of the bit line structure main parts BSM, particularly, the upper conductive layer 43A containing a metal could be oxidized decreases, and accordingly, the possibility of breaking of the bit lines BL due to oxidation also decreases.

The plurality of bit line structure expansions BSE formed in the above-mentioned way is connected to the bit line structure main parts BSM, respectively, and are alternately arranged in the two interface areas IA. Each of the bit line structure expansions BSE includes a bit line expansion BLE, and a capping layer expansion BAE formed on the bit line expansion BLE, similarly to the bit line structure main parts BSM. The bit line expansions BLE may include the lower, intermediate, upper conductive layers 41B, 42B, and 43B formed from the conductive layers 410, 420, and 430, respectively, and the capping layer expansions BAE may include the lower, intermediate, and upper insulating layers 44B, 45B, and 46B formed from the insulating layers 440, 450, and 460, respectively.

Figure 15:
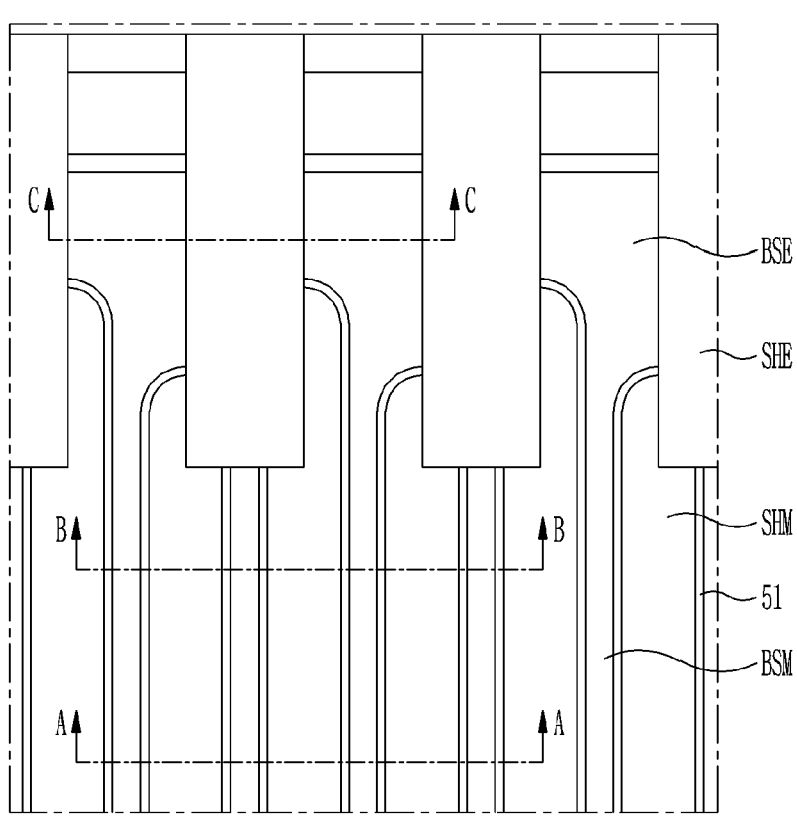

Referring to FIG. 15, each of the plurality of expansion separation grooves SHE separating the bit line structure expansions BSE may laterally overlap (i.e., in the x-direction) two adjacent main-part separation grooves SHM and a bit line structure main part BSM interposed therebetween. The expansion separation grooves SHE may be rectangular, but are not limited thereto.

Referring to FIG. 18 to FIG. 21, intermediate spacers 52 are stacked and are subjected to etch back together with the inner spacers 51 and the buffer layer 30 such that the surface of the substrate 10 is exposed. In this way, the parts of the substrate 10 in the main-part separation grooves SHM and the expansion separation grooves SHE can be exposed (see FIG. 19). During this process, the parts of the intermediate spacers 52 and the inner spacers 51 covering the upper surfaces of the bit line structure main parts BSM and the bit line structure expansions BSE may be removed. According to the embodiment, the exposed upper parts of the substrate 10 may be etched such that the bottom surfaces of the main-part separation groove SHM and the expansion separation groove SHE become lower than the upper surface of the substrate 10.

Figure 25:
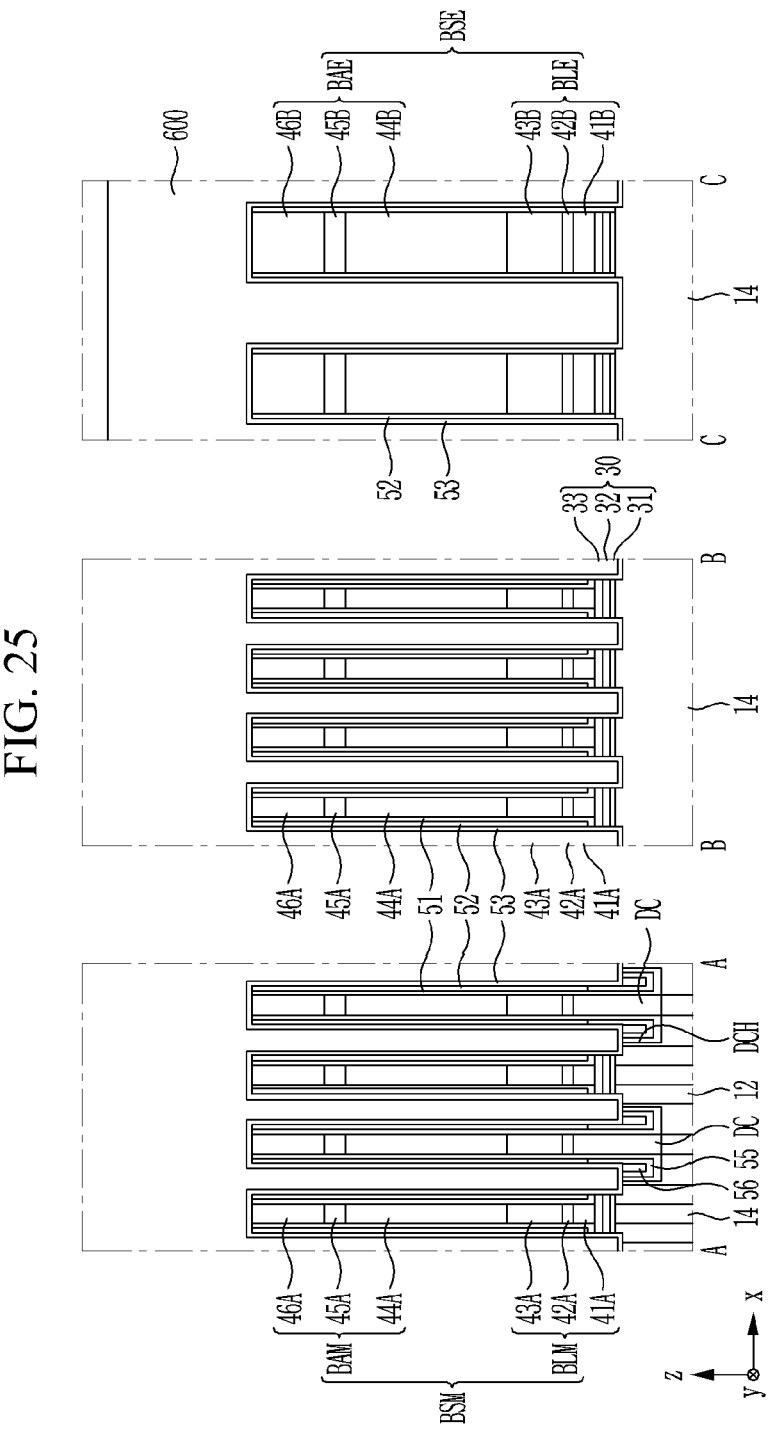
Figure 26:
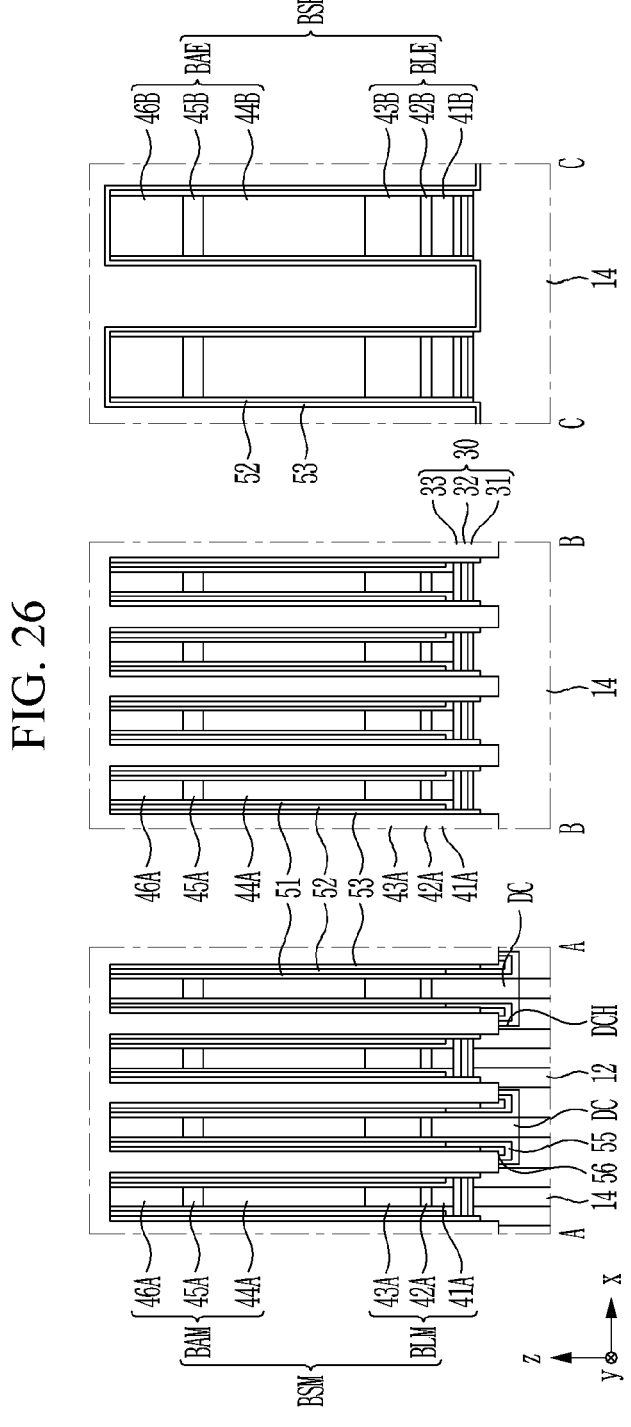

Referring to FIG. 22 to FIG. 25, outer spacers 53 may be stacked, and referring to FIG. 25, a photosensitive film 600 may be formed so as to cover the interface areas IA. Referring to FIG. 26, etch back may be performed using the photosensitive film 600 as a mask such that the surface of the substrate 10 in the cell array area CA is exposed again, and the photosensitive film 600 is removed, for example by ashing and stripping. During this process, the parts of the outer spacers 53 on the upper surfaces of the bit line structure main parts BSM may be removed, and some parts of the outer spacers 53 on the side surfaces may also be removed. However, the parts of the outer spacers 53 in the interface areas IA, covered by the photosensitive film 600, remain as they are.

During the process described with reference to FIG. 18 to FIG. 25, some parts of the upper parts of the inner, intermediate, and outer spacers 51, 52, and 53 covering the bit line structure main parts BSM may be removed (see FIG. 3).

Figure 27:
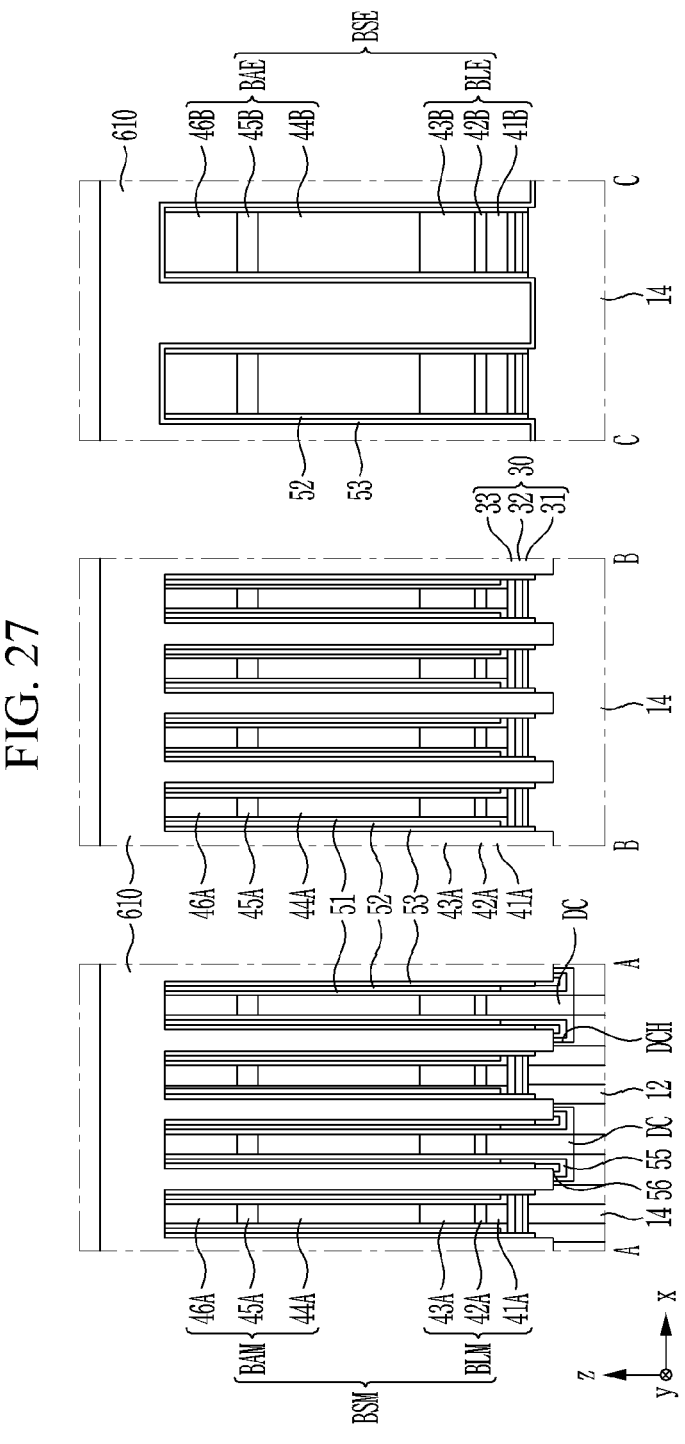
Figure 28:
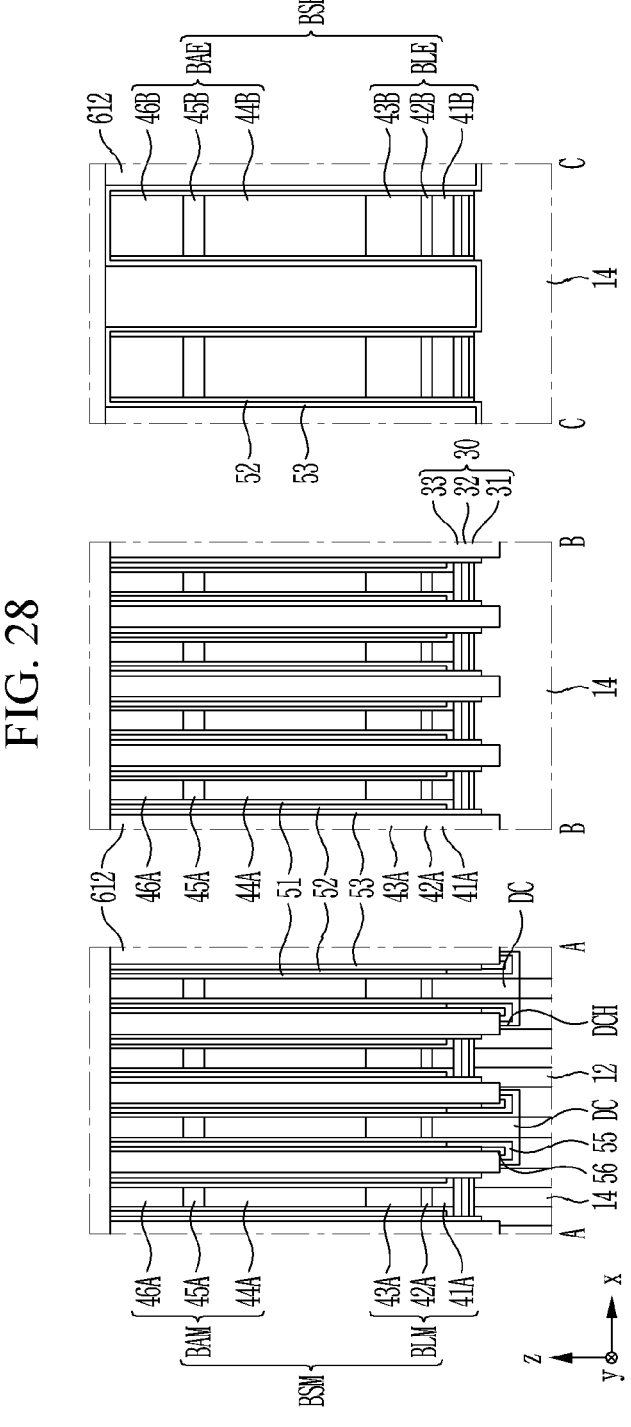

Referring to FIG. 27, a conductive layer 610, which may contain polysilicon, etc., is stacked, and referring to FIG. 28, the upper surface of the conductive layer 610 may be aligned (i.e., made coplanar) with the upper surfaces of the bit line structure main parts BSM and the bit line structure expansions BSE by polishing, etc. In this case, only the parts of the conductive layer 610 in the main-part separation groove SHM and the expansion separation groove SHE shown in FIG. 23 remains, and in FIG. 28, the remaining parts of the conductive layer 610 are denoted by the reference symbol "612". During this process, parts of the outer spacers 53 covering the upper surfaces of the bit line structure expansions BSE in the interface areas IA may also be removed (see FIG. 3), or may remain as they are (see FIG. 28).

Next, from the remaining parts 612 of the conductive layer, parts corresponding to the partitions 48 shown in FIG.

1 to FIG. 3 are removed such that a plurality of trenches is formed, and the trenches are filled with an insulating material, whereby the partitions 48 are formed. The partitions 48 may extend along in the transverse direction so as to intersect with the remaining parts 612 of the conductive layer extending in the longitudinal direction. The lower surfaces of the partitions 48 may be located below the lower surfaces of the remaining parts 612 of the conductive layer, and the upper surfaces of the partitions 48 may be at a level with the upper surfaces of the remaining parts 612 of the conductive layer. Therefore, the remaining parts 612 of the conductive layer are separated as a plurality of isolated parts by the partitions 48 (or the trenches).

During the trench forming process, some parts of the upper parts of the capping layer main parts BAM of the bit line structure main parts BSM may be removed, whereby the parts in which the partitions 48 are location of the bit line structure main parts BSM as shown in FIG. 3 may be formed.

Next, the upper parts of the remaining parts 612 of the conductive layer may be removed by etch back, etc., so as to lower the height in the vertical (z-direction) (reference symbols "61A" and "61B of FIG. 3), and on them, the conductive upper layers 62A and 62B (FIG. 3) may be formed. In this way, the buried contacts BC including the lower layers 61A and the upper layers 62A may be formed in the cell array area CA, and the conductive isolation layers including the lower layers 61B and the upper layers 62B may be formed in the interface areas IA. According to the embodiment, the lower layers 61A and 61B may contain polysilicon, and the upper layers 62A and 62B may contain metal silicide. When the upper layers 62A and 62B are formed of metal silicide, the upper layers may be formed by forming a layer of a metal (for example, Co, Ti, Ni, etc.) which can react with silicon to form silicide and performing thermal treatment.

According to the embodiment, the above-described process of removing some parts of the upper parts of the remaining parts 612 of the conductive layer and forming the conductive upper layers may be applied to only the cell array area CA, and may not be applied to the interface areas IA. This is possible since the above-mentioned process is performed after the photosensitive film is formed on the interface areas IA.

According to another embodiment, the main-part separation groove SHM and the expansion separation groove SHE in the interface areas IA may be filled with an insulating material, instead of the conductive layer 610.

Next, the bit line structure expansions BSE are etched such that contact plug contact holes exposing the bit line expansions BLE are formed. Subsequently, a conductive barrier layer and a conductive layer are stacked, and these two layers and other layers below them are patterned such that the plurality of landing pads LP and the plurality of contact plugs CP are formed. Finally, the spaces between the plurality of landing pads LP and the plurality of contact plugs CP are filled with the pad separation insulating layer 70.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Spatially descriptive terms such as, but not limited to, "above," "over," "below," "under," "upper" and "lower" may be used herein to indicate a position of elements, structures or features relative to one another as illustrated in the figures, rather than absolute positioning. Thus, the semiconductor device may be otherwise oriented (e.g., rotated 90 degrees or at other orientations), and the spatially relative descriptions used herein may be interpreted accordingly.

It will also be understood that when an element such as a layer, region or substrate is referred to as being "atop," "above," "on" or "over" another element, it is broadly intended that the element be in direct contact with the other element or intervening elements can also be present. In contrast, when an element is referred to as being "directly on" or "directly over" another element, it is intended that there are no intervening elements present. Likewise, it should be appreciated that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

10: Substrate
12: Active region (AC)
14: Region partition layer
22: Gate insulating layer
24: Word line (WL)
26: Word line capping layer
30: Buffer layer
31, 32, 33: Insulating layer
41A, 41B, 42A, 42B, 43A, 43B, 410, 420, 430: Conductive layer
44A, 44B, 45A, 45B, 46A, 46B, 440, 450, 460: Insulating layer
48: Partition
50: Bit line spacer
50M: Main-part spacer
50E: Expansion spacer
51, 51A: Inner spacer
52, 52A, 52B: Intermediate spacer
53, 53A, 53B: Outer spacer
55, 56: Filling spacer
64A, 64B: Conductive barrier layer
66A, 66B: Conductive layer
70: Pad separation insulating layer
500: Hard mask stack
510, 520, 580: Hard mask
512, 522, 582: Hard mask lower layer
514, 524, 584: Hard mask upper layer
550, 590, 600: Photosensitive film
BA: Bit line capping layer
BAE: Capping layer expansion
BAM: Capping layer main part
BC: Buried contact
BL: Bit line BLE: Bit line expansion
BLM: Bit line main part
BS: Bit line structure
BSE: Bit line structure expansion
BSM: Bit line structure main part
CA: Cell array area
CP: Contact plug
DC: Direct contact
DCH: Direct contact hole
IA: Interface area
LP: Landing pad
SHE: Expansion separation groove
SHM: Main-part separation groove
WL: Word line
WS: Word line structure

What is claimed is:

1. A method of manufacturing a semiconductor device, the method comprising:

forming a buffer layer on a substrate, the substrate including a plurality of active regions and a plurality of word lines;

sequentially stacking a first conductive layer and a first insulating layer in a first direction perpendicular to an upper surface of the substrate;

forming a plurality of bit line structure main parts such that each of the plurality of bit line structure main parts is in contact with one or more of the active regions through a plurality of first contacts, by etching the first insulating layer and the first conductive layer;

stacking first spacers;

forming a plurality of bit line structure expansions by etching the first spacers, the first insulating layer, and the first conductive layer; and forming a plurality of second contacts such that the second contacts are in contact with the plurality of active regions, respectively, wherein each of the plurality of active regions includes a first part and a second part located on opposite sides with respect to a word line, each of the plurality of bit line structure main parts is in contact with one or more of the first parts of the active regions and the first contacts, each of the plurality of second contacts is in contact with the second part of one of the active regions, and the plurality of bit line structure expansions are connected to the plurality of bit line structure main parts, respectively, and are wider than the plurality of bit line structure main parts, respectively, as viewed in a plan view.

2. The method according to claim 1, wherein forming the plurality of bit line structure main parts includes forming a plurality of main-part separation grooves, each of the plurality of main-part separation grooves separating two adjacent bit line structure main parts of the plurality of the bit line structure main parts, forming the plurality of bit line structure expansions includes forming a plurality of expansion separation grooves, each of the plurality of expansion separation grooves separating two adjacent bit line structure expansions of the plurality of bit line structure expansions, and each of the plurality of expansion separation grooves laterally overlaps two adjacent main-part separation grooves of the plurality of main-part separation grooves.

3. The method according to claim 2, wherein the two adjacent main-part separation grooves are different from each other in their lengths.

4. The method according to claim 2, wherein forming the plurality of expansion separation grooves includes removing parts of the buffer layer exposed by the plurality of expansion separation grooves.

5. The method according to claim 4, further comprising: after removing the parts of the buffer layer exposed from the plurality of expansion separation grooves, stacking second spacers.

6. The method according to claim 5, further comprising: exposing the substrate by removing at least parts of the second spacers, the first spacers, and parts of the buffer layer on bottom surfaces of the plurality of main-part separation grooves and bottom surfaces of the plurality of expansion separation grooves.

7. The method according to claim 6, wherein exposing the substrate includes etching some of upper parts of the exposed parts of the substrate.

8. The method according to claim 6, further comprising: after exposing the substrate, stacking third spacers on the second spacers.

9. The method according to claim 8, further comprising: exposing second parts of the substrate by removing at least parts of the third spacers on the bottom surfaces of the plurality of main-part separation grooves.

10. The method according to claim 9, wherein exposing the second parts of the substrate includes:

forming a photosensitive film on the plurality of bit line structure expansions and the plurality of expansion separation grooves; and removing parts of the third spacers on the plurality of bit line structure main parts and parts of the third spacers on the bottom surfaces of the plurality of main-part separation grooves, using the photosensitive film as a mask.

11. The method according to claim 9, wherein forming the plurality of second contacts includes:

stacking a second conductive layer on the first conductive layer after exposing the second parts of the substrate; and forming the plurality of second contacts by etching the second conductive layer.

12. The method according to claim 11, wherein forming the plurality of second contacts by etching the second conductive layer includes:

forming trenches separating the second conductive layer; and forming a plurality of partitions by filling the trenches with an insulating material.

13. The method according to claim 12, wherein forming the plurality of second contacts by etching the second conductive layer further includes dividing the second conductive layer by etching an upper surface of the second conductive layer such that the upper surface of the second conductive layer is coplanar with upper surfaces of the plurality of bit line structure main parts, before forming the trenches, and the trenches divide the second conductive layer that was separated by the trenches.

14. The method according to claim 9, further comprising: filling the plurality of expansion separation grooves with an insulating material.

* * * * *